(12) United States Patent
Tran et al.

(10) Patent No.: US 7,279,379 B2
(45) Date of Patent: Oct. 9, 2007

(54) METHODS OF FORMING MEMORY ARRAYS; AND METHODS OF FORMING CONTACTS TO BITLINES

(75) Inventors: Luan C. Tran, Meridian, ID (US); Fred D. Fishburn, Boise, ID (US)

(73) Assignee: Micron Technology, Inc., Boise, ID (US)

(*) Notice: Subject to any disclaimer, the term of this patent is extended or adjusted under 35 U.S.C. 154(b) by 111 days.

(21) Appl. No.: 10/832,543

(22) Filed: Apr. 26, 2004

(65) Prior Publication Data

US 2005/0236656 A1    Oct. 27, 2005

(51) Int. Cl.
H01L 21/00    (2006.01)

(52) U.S. Cl. .................................. 438/239; 438/253

(58) Field of Classification Search ............ 438/128, 438/570, 630, 603, 638, 238, 239, 386, 399, 438/253
See application file for complete search history.

(56) References Cited

U.S. PATENT DOCUMENTS

| | | | |
|---|---|---|---|
| 5,792,687 A | 8/1998 | Jeng et al. | |
| 6,022,776 A | 2/2000 | Lien et al. | |
| 6,037,211 A | 3/2000 | Jeng et al. | |
| 6,198,122 B1 | 3/2001 | Habu et al. ............... | 257/296 |
| 6,258,649 B1 | 7/2001 | Nakamura et al. | |
| 6,291,335 B1 | 9/2001 | Schnabel et al. | |
| 6,355,545 B1* | 3/2002 | Ohba ....................... | 438/570 |
| 6,465,351 B1 | 10/2002 | Jeong ........................ | 438/689 |
| 6,528,888 B2* | 3/2003 | Cho et al. ................. | 257/775 |
| 6,545,306 B2 | 4/2003 | Kim et al. | |
| 6,713,807 B2 | 3/2004 | Weimer et al. | |
| 6,875,684 B2 | 4/2005 | Jin et al. | |
| 6,909,128 B2 | 6/2005 | Ireland | |
| 6,963,679 B1 | 11/2005 | Novotny et al. ............ | 385/18 |
| 6,965,139 B2 | 11/2005 | Ohno | |
| 7,002,199 B2 | 2/2006 | Fukuzumi | |

(Continued)

FOREIGN PATENT DOCUMENTS

EP   PCT/US2005/014466    4/2005

OTHER PUBLICATIONS

*A Novel Bit-Line Process Using Poly-Si Masked Dual-Damascene (PMDD) for 0.13* 361: pp. 15.4.1-15.4.4: IEEE 2000.

(Continued)

*Primary Examiner*—Evan Pert
(74) *Attorney, Agent, or Firm*—Wells St. John P.S.

(57) ABSTRACT

The invention includes memory arrays, and methods which can be utilized for forming memory arrays. A patterned etch stop can be used during memory array fabrication, with the etch stop covering storage node contact locations while leaving openings to bitline contact locations. An insulative material can be formed over the etch stop and over the bitline contact locations, and trenches can be formed through the insulative material. Conductive material can be provided within the trenches to form bitline interconnect lines which are in electrical contact with the bitline contact locations, and which are electrically isolated from the storage node contact locations by the etch stop. In subsequent processing, openings can be formed through the etch stop to the storage node contact locations. Memory storage devices can then be formed within the openings and in electrical contact with the storage node contact locations.

55 Claims, 40 Drawing Sheets

U.S. PATENT DOCUMENTS

| | | |
|---|---|---|
| 2002/0100980 A1 | 8/2002 | Sugiyama et al. |
| 2002/0130417 A1 | 9/2002 | Yew et al. .................. 257/758 |
| 2003/0020108 A1 | 1/2003 | Weimer et al. |
| 2003/0042518 A1 | 3/2003 | Uchiyama et al. |
| 2003/0049903 A1 | 3/2003 | Mitani |
| 2003/0122174 A1 | 7/2003 | Fukuzumi |

OTHER PUBLICATIONS

"*A Novel Bit Line—SToFM (Spacerless Top-Flat Mask)—Technology for 90nm DRAM generation and Beyond*": Symposium on VLSI Technology: Digest of Technical Papers; pp. 182 & 183.

* cited by examiner

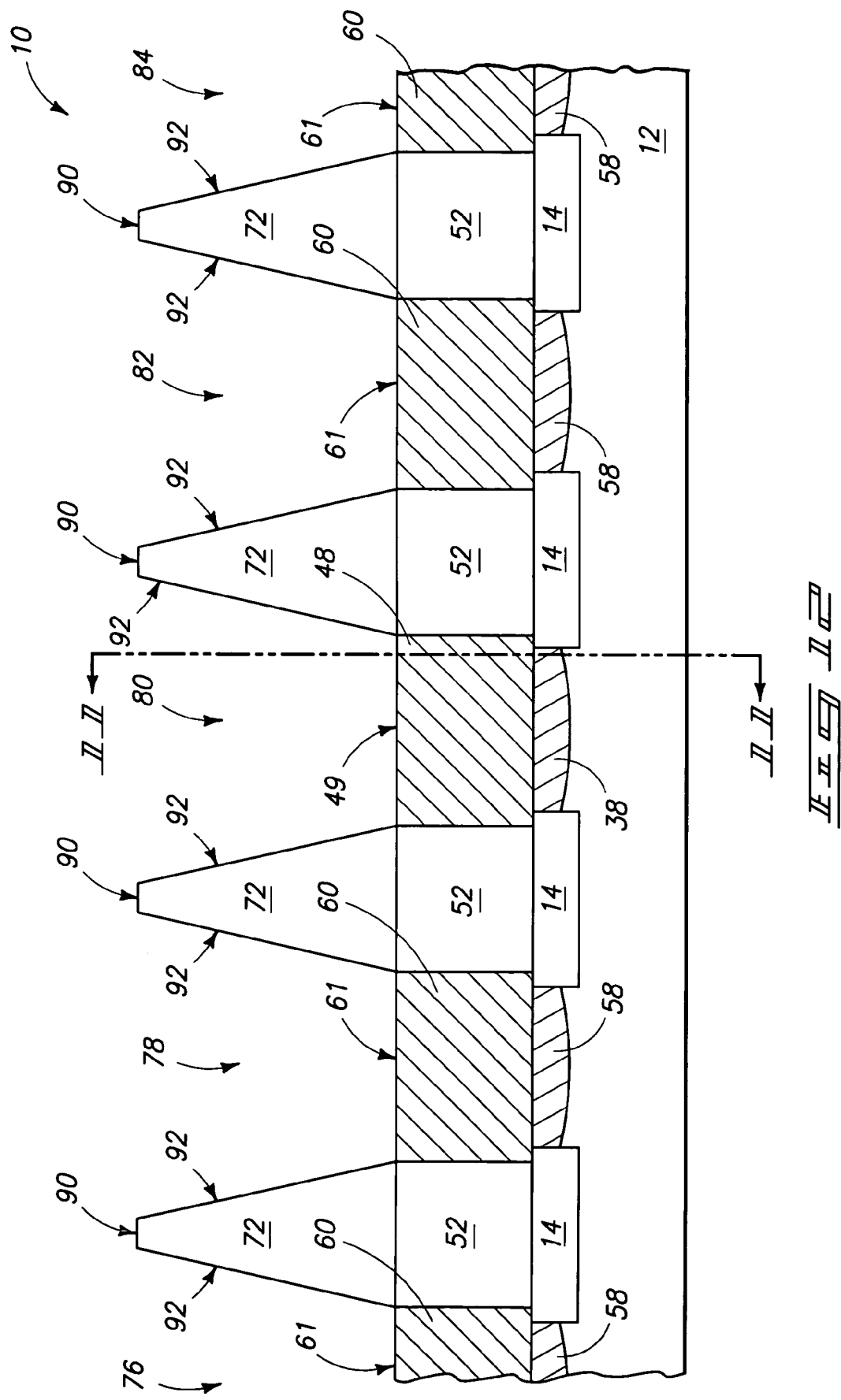

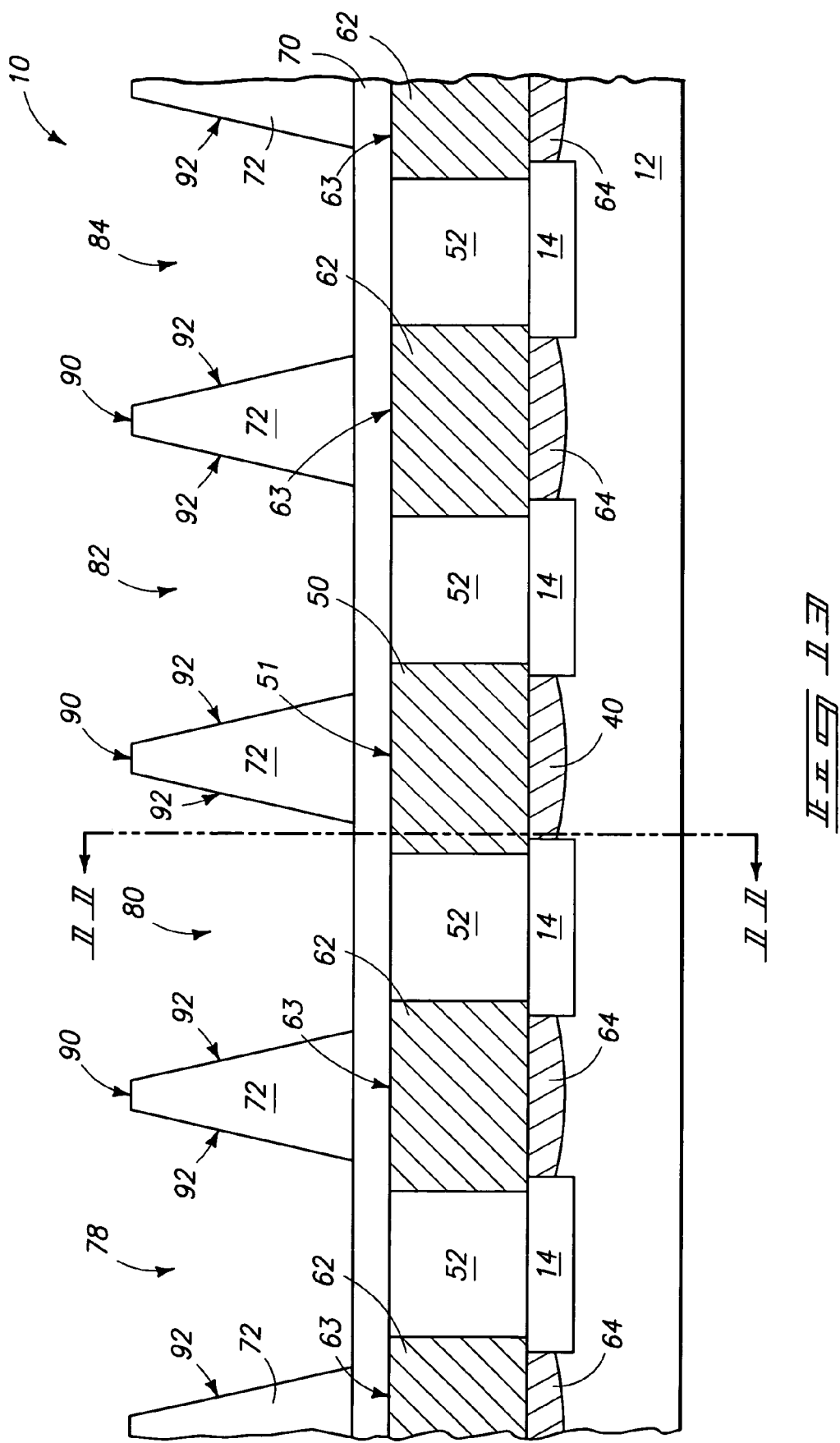

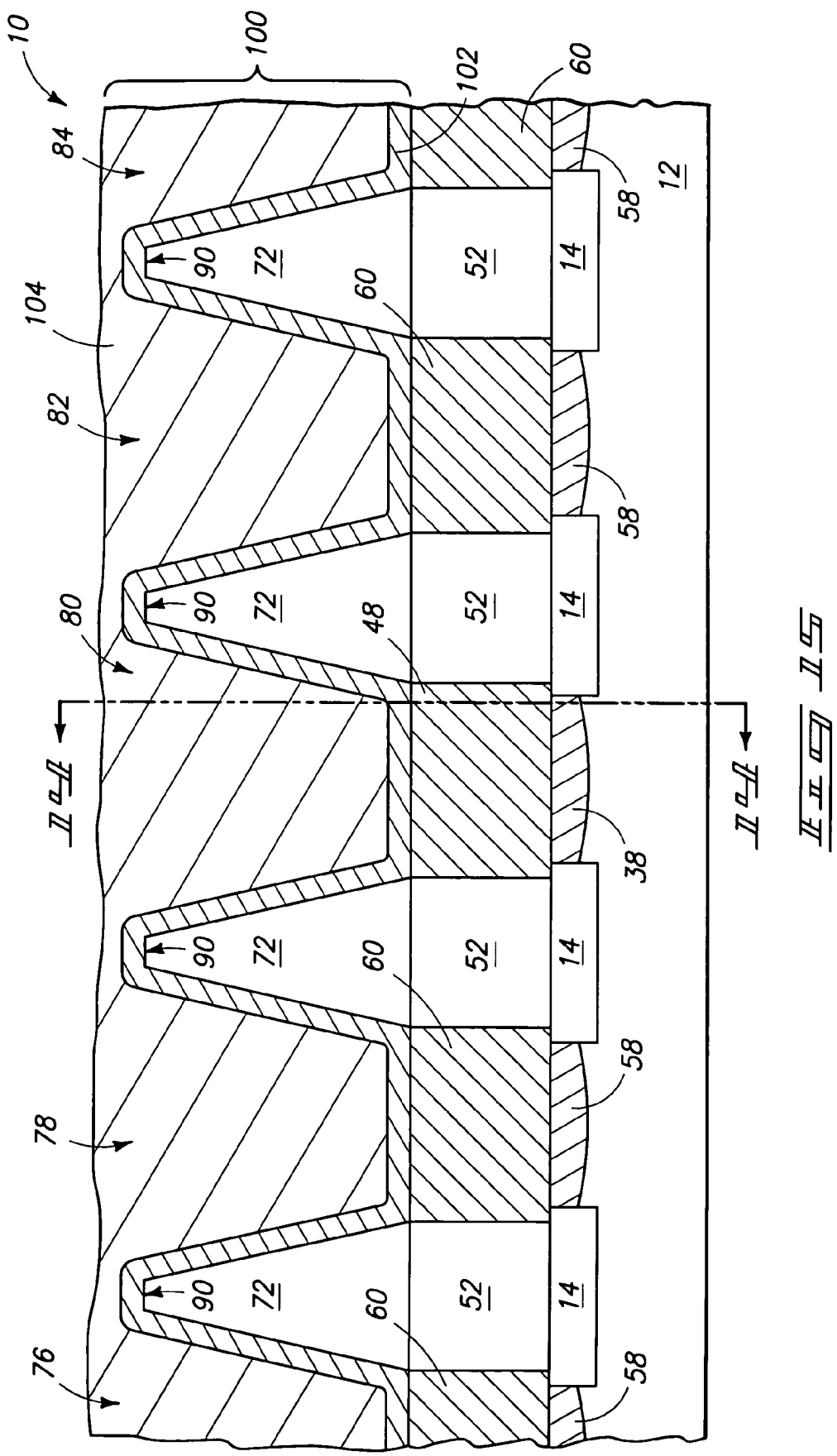

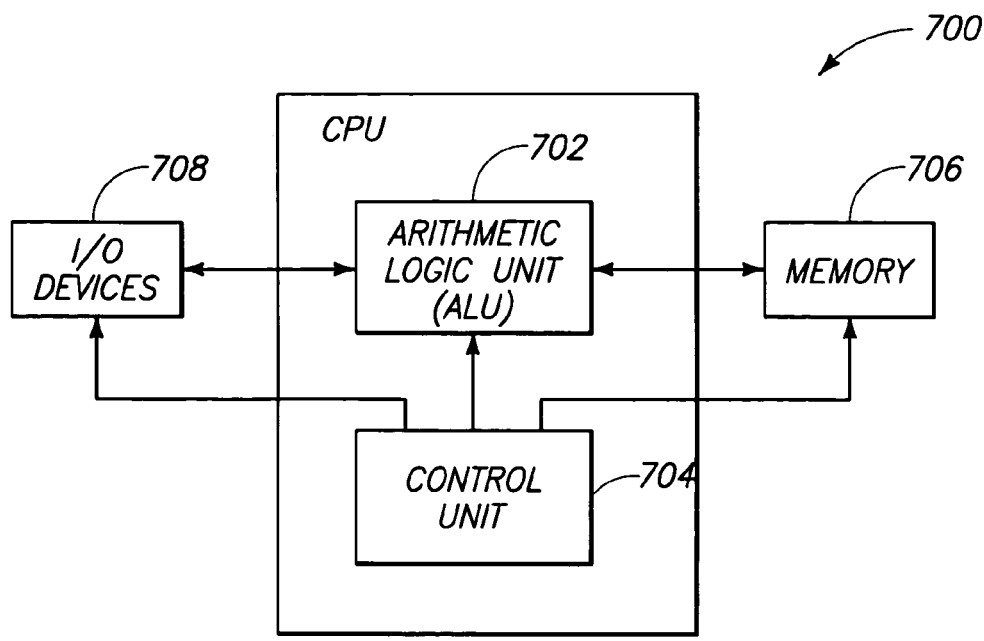
$\mathbb{F}\mathbb{I}\mathbb{G}\ 41$
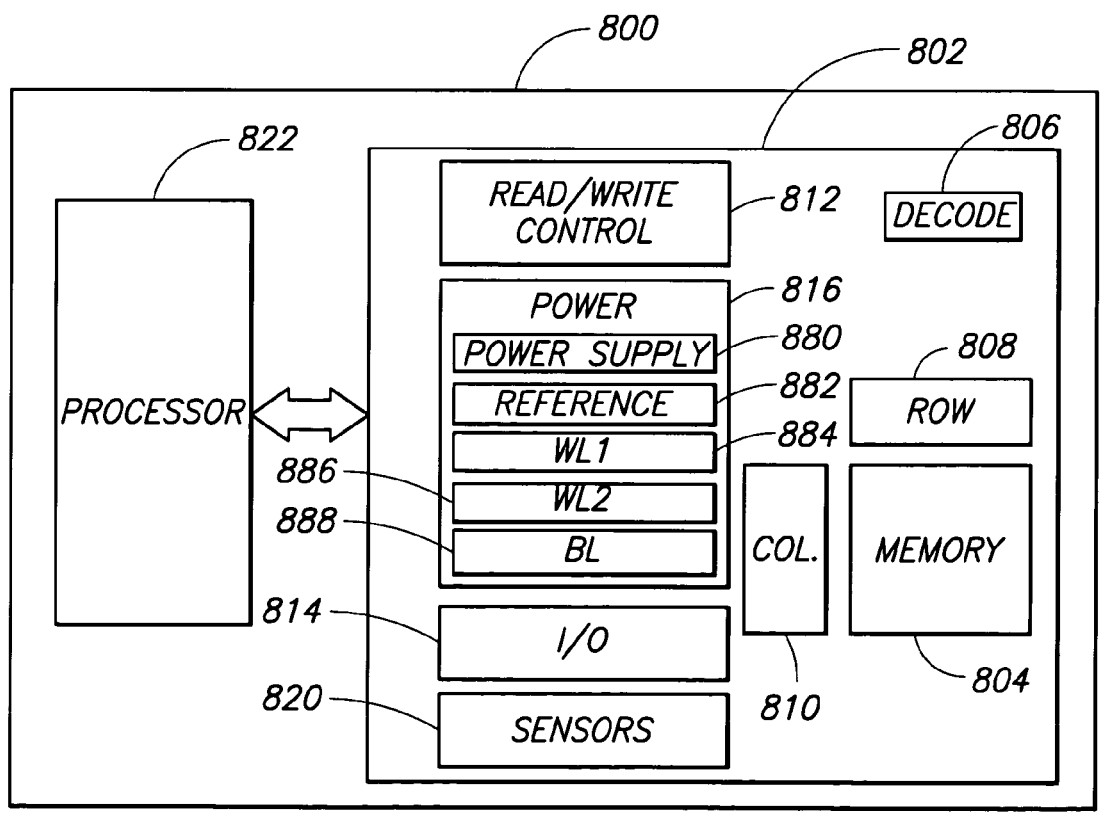
$\mathbb{F}\mathbb{I}\mathbb{G}\ 42$

METHODS OF FORMING MEMORY ARRAYS; AND METHODS OF FORMING CONTACTS TO BITLINES

TECHNICAL FIELD

The invention pertains to memory arrays (such as DRAM arrays), methods of forming memory arrays, and methods of forming contacts to bitlines. The invention also pertains to methods of forming storage nodes for DRAM arrays.

BACKGROUND OF THE INVENTION

Memory arrays are utilized for programmable data storage. For instance, dynamic random access memory (DRAM) is commonly utilized for programmable memory storage. The DRAM will typically be formed as an array of individual memory cells, with each cell comprising a transistor and a memory storage device. The memory storage devices will typically be capacitors. The transistors will be formed within wordlines which extend across the DRAM array. A series of bitlines will also be provided across the DRAM array. Bits of information are written to, or read from, a memory storage device of an individual DRAM cell by activating a specific combination of a wordline and a bitline. Accordingly, each memory device of the DRAM array can be specifically addressed with the appropriate combination of a wordline and a bitline.

DRAM arrays are typically fabricated as integrated circuitry associated with a semiconductor substrate. Continuing goals of semiconductor device processing are to increase a scale of integration, simplify processing, and reduce costs. It is desired to create new methods of forming DRAM arrays for progressing toward one or more of such continuing goals.

Inventive aspects described herein can be particularly useful for fabrication of DRAM arrays. However, it is to be understood that although the invention is described herein primarily for application to DRAM arrays, the invention can also be applied to other semiconductor fabrication processes and to other memory arrays, as will be recognized by persons of ordinary skill in the art.

SUMMARY OF THE INVENTION

In one aspect, the invention pertains to a method of forming bitline contacts for a memory array. A semiconductor substrate is provided. The substrate has two sets of conductive nodes, with one of the sets being defined as a first set and the other being defined as a second set. A patterned etch stop is formed over the substrate. The patterned etch stop covers the second set of conductive nodes and has openings extending through it to the first set of conductive nodes. An electrically insulative material is formed over the patterned etch stop, and trenches are etched through the insulative material. The trenches extend to the patterned etch stop, and extend through the openings in the patterned etch stop to the first set of conductive nodes. A conductive material is provided within the trenches and in electrical contact with the first set of conductive nodes. Memory storage devices (for instance, capacitor structures) are formed in electrical contact with the second set of conductive nodes. A bitline is formed in electrical contact with the conductive material that had been provided within the trenches, and accordingly such conductive material is incorporated into a bitline interconnect.

In one aspect, the invention pertains to a method of forming storage nodes for a DRAM array. A semiconductor construction is provided. The construction includes a plurality of storage node contact locations. A stack is formed over the storage node contact locations. The stack includes: a first electrically insulative material over the storage node locations, a plurality of spaced electrically conductive lines over the first electrically insulative material, a second electrically insulative material filling spaces between the spaced electrically conductive lines, and a plurality of spaced electrically insulative lines directly over the electrically conductive lines and in a one-two-one correspondence with the electrically conductive lines. Each of the electrically conductive lines has a pair of opposed lateral edges and a first lateral width between the opposed lateral edges. The electrically insulative lines have opposed lateral edges and a second lateral width between the opposed lateral edges which is greater than the first lateral width. Openings are etched which extend entirely through the first and second electrically insulative materials to the storage node locations. The openings are aligned with the lateral edges of the spaced electrically insulative lines. Capacitors are formed having storage nodes within the openings. The storage nodes are in electrical contact with the storage node contact locations.

In one aspect, the invention encompasses a DRAM array. The array includes a semiconductor substrate and a plurality of transistor constructions supported by the substrate. Each transistor construction has a transistor gate and a pair of source/drain regions, with the paired source/drain regions including a bitline contact source/drain region and a storage node contact source/drain region. A plurality of bitline interconnect stacks are over the substrate and electrically connected to the bitline contact source/drain regions. The bitline interconnect stacks are separated from the storage node contact source/drain regions by at least an electrically insulative layer which comprises one or more of silicon nitride, silicon oxynitride and undoped silicon dioxide. Each of the bitline interconnect stacks includes: an electrically conductive bitline interconnect line, an electrically insulative cap over the conductive bitline interconnect line, and a pair of electrically insulative sidewall spacers covering sidewalls of the electrically conductive bitline interconnect line. The bitline interconnect line has a first lateral width, and the electrically insulative cap has a second lateral width which is greater than the first lateral width. The DRAM array additionally comprises a plurality of capacitor constructions which have storage nodes extending through the electrically insulative layer and in electrical contact with the storage node contact source/drain regions.

BRIEF DESCRIPTION OF THE DRAWINGS

Preferred embodiments of the invention are described below with reference to the following accompanying drawings.

FIGS. 2 and 3 are along the cross-sections 2—2 and 3—3 of FIG. 1; and FIG. 1 is along the cross-sections 1—1 of FIGS. 2 and 3.

FIGS. 11–13 are views of the cross-sectional fragments of FIGS. 1–3, respectively, shown at a processing stage subsequent to that of FIGS. 8–10. The cross-sections of FIGS. 12 and 13 are shown along the lines 12—12 and 13—13 of FIG. 11, and the cross-section of FIG. 11 is shown along the lines 11—11 of FIGS. 12 and 13.

FIGS. 14–16 are views of the cross-sectional fragments of FIGS. 1–3, respectively, shown at a processing stage subsequent to that of FIGS. 11–13. The cross-sections of FIGS. 15 and 16 are shown along the lines 15—15 and 16—16 of FIG. 14, and the cross-section of FIG. 14 is shown along the lines 14—14 of FIGS. 15 and 16.

FIG. 41 is a high-level block diagram of an electronic system according to an exemplary aspect of the present invention.

FIG. 42 is a simplified block diagram of an exemplary memory device according to an aspect of the present invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

One aspect of the invention pertains to formation of DRAM arrays. The arrays comprise storage node contact locations and bitline contact locations. An etch stop is utilized to protect the storage node contact locations during formation of trenches which extend to the bitline contact locations. Subsequently, conductive material is formed within the trenches to form bitline interconnects extending to the bitline contact locations. The conductive material is shaped into conductive lines by the formation of the conductive material within the trenches. In particular aspects, the formation of such conductive material can be considered to correspond to incorporation of a damascene process into methodology for fabrication of bitline interconnects associated with a DRAM array.

After the conductive bitline interconnect material is formed, an insulative cap can be formed over the bitline interconnect material. The insulative cap can have a lateral periphery extending beyond lateral edges of the bitline conductive interconnect material. An etch can be conducted which is self-aligned relative to the lateral edges of the insulative cap to form openings extending through the etch stop and to the storage node contact locations. Capacitor storage nodes can then be formed within the openings. Exemplary aspects of the present invention are described with reference to FIGS. 1–42.

Figure 1:
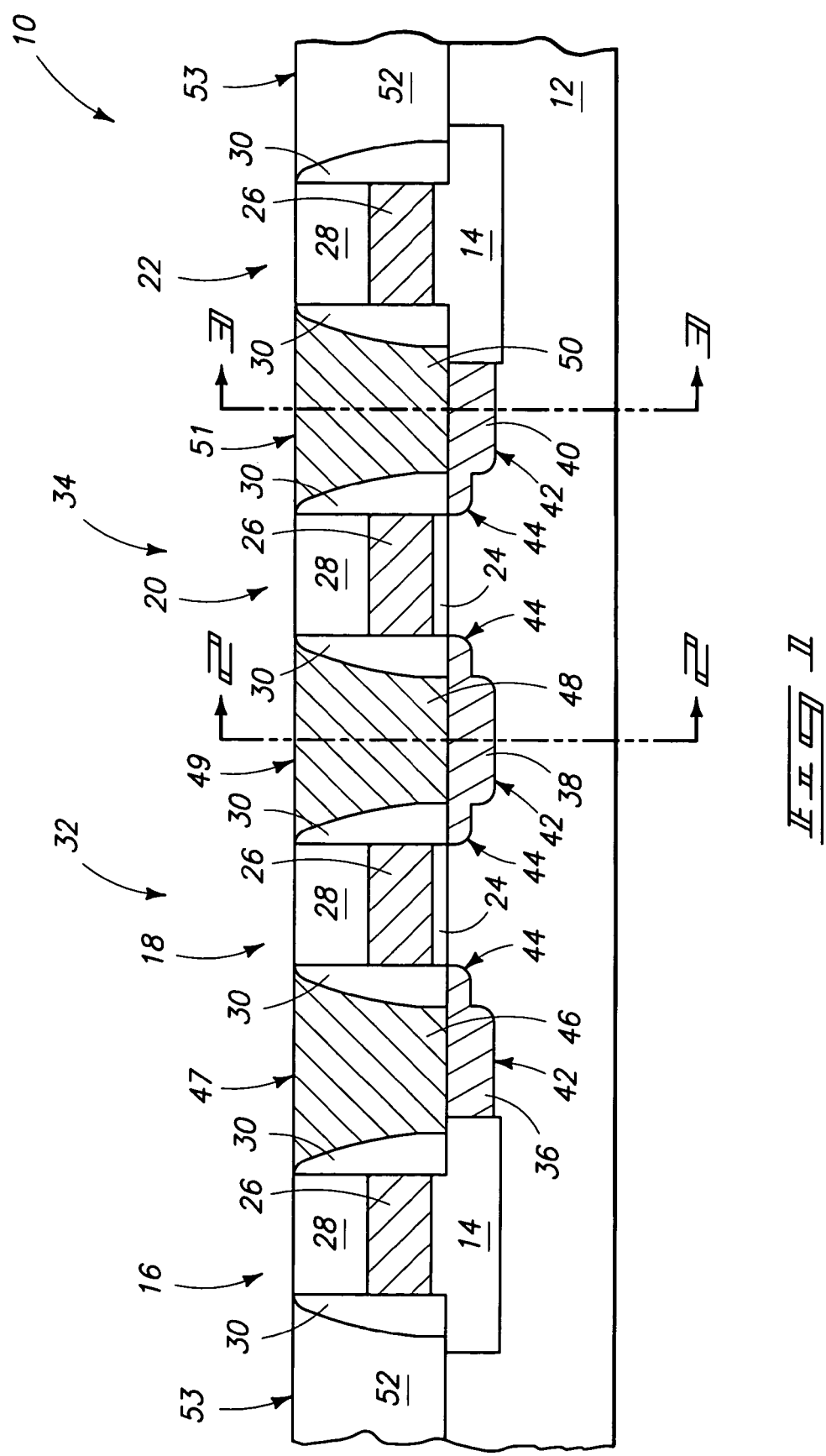
FIGS. 1–3 are diagrammatic, cross-sectional views of a semiconductor wafer fragment at a preliminary processing stage of an exemplary aspect of the present invention.
Figure 2:
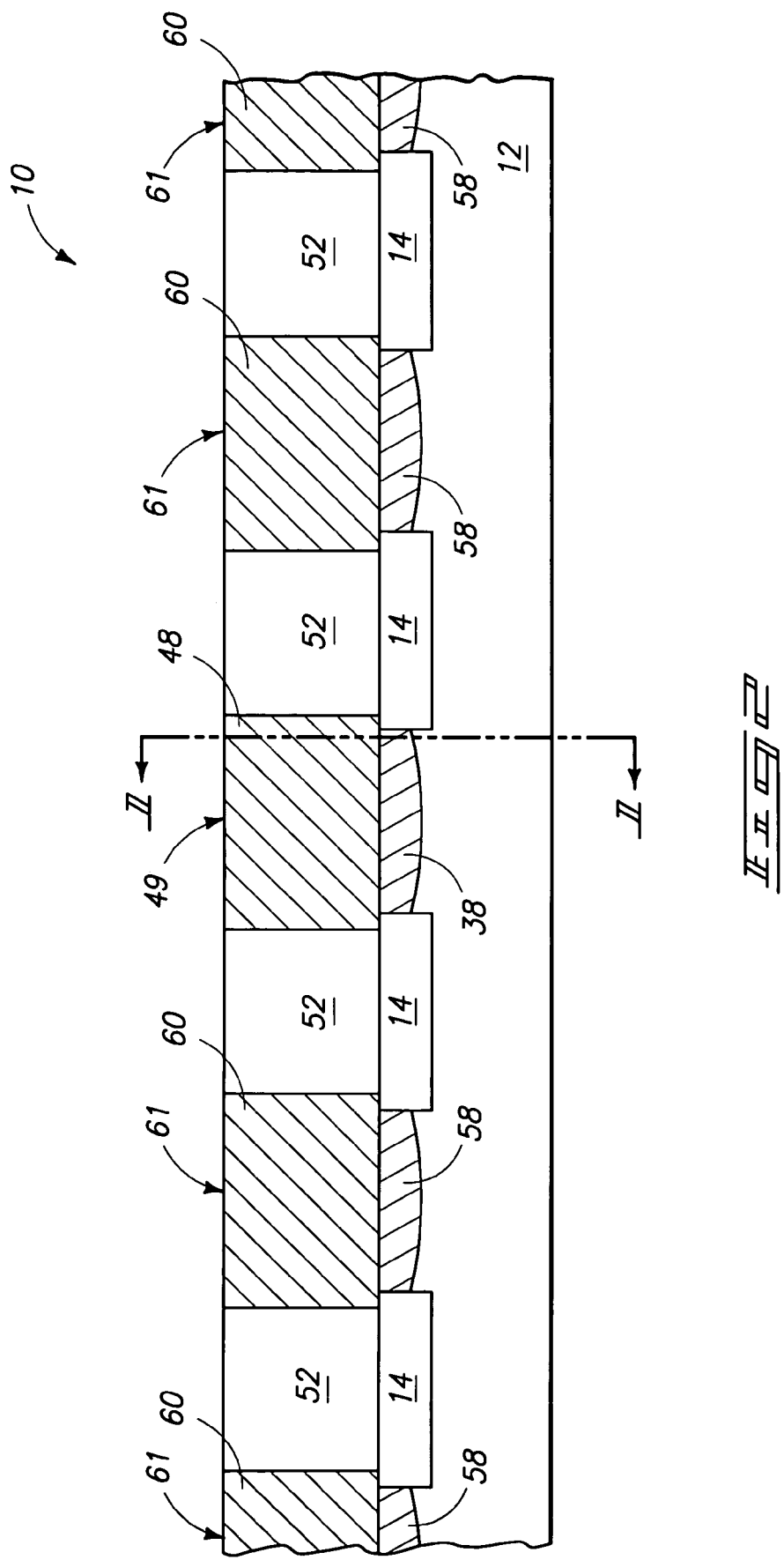
Figure 3:
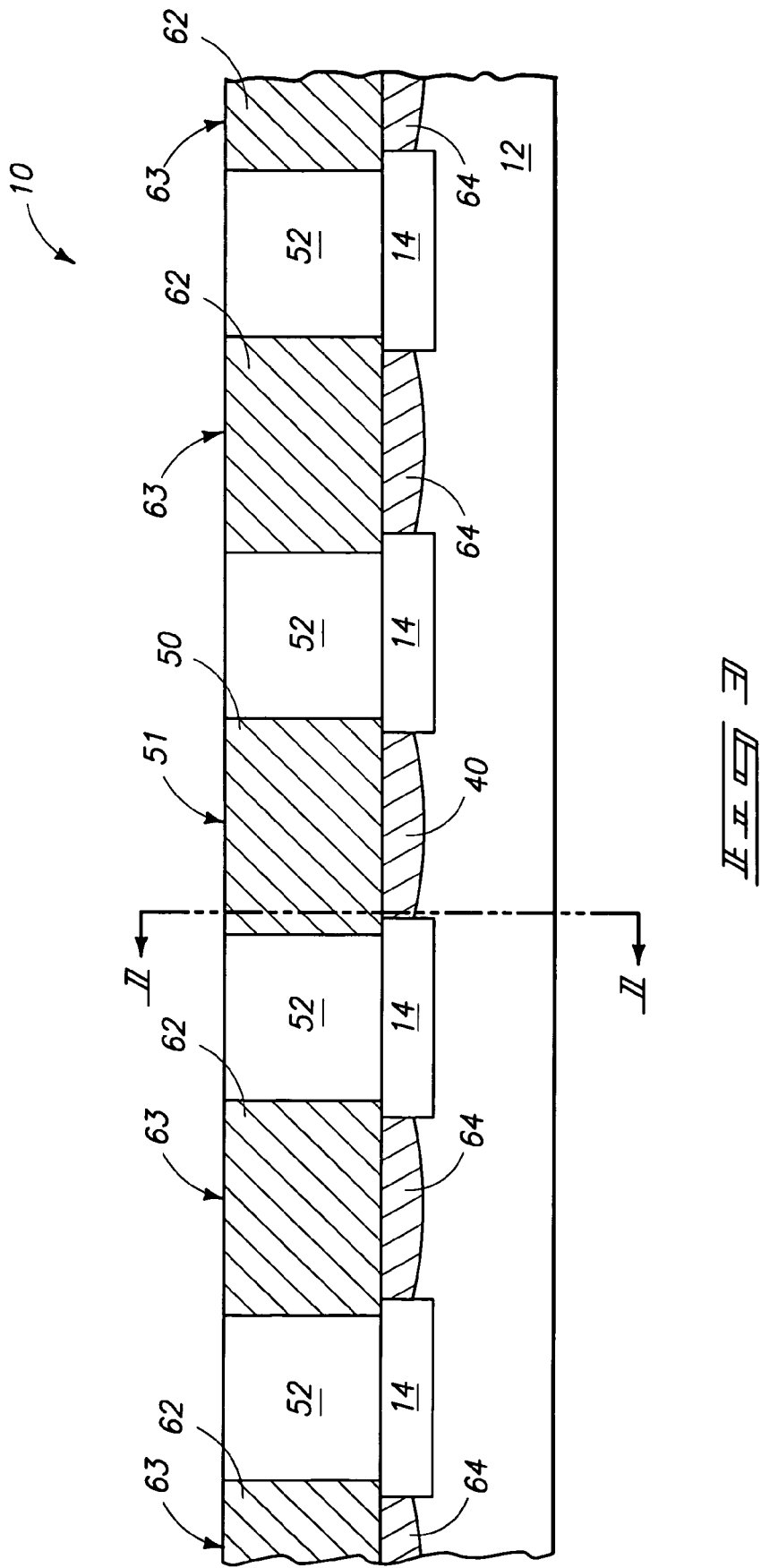

Referring initially to FIGS. 1–4, a fragment of a semiconductor wafer is shown as a semiconductor construction 10. The construction 10 is illustrated at a preliminary processing stage of an exemplary aspect of the present invention, and is shown in FIGS. 1–3 to comprise a semiconductor substrate 12. Substrate 12 can be, for example, a monocrystalline silicon wafer lightly-doped with background p-type dopant. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Isolation regions 14 are shown in FIGS. 1–3. The isolation regions extend within substrate 12. Isolation regions 14 can correspond to, for example, shallow trench isolation regions, and accordingly can comprise, consist essentially of, or consist of silicon dioxide.

FIG. 1 shows a set of four wordlines 16, 18, 20 and 22 extending over substrate 12. Each of the wordlines comprises a stack which includes an electrically conductive material 26, and an electrically insulative cap 28. The central wordlines also include an insulative material 24 beneath conductive material 26. Insulative material 24 can, for example, comprise, consist essentially of, or consist of silicon dioxide, and in particular aspects can be referred to as a gate oxide. Conductive material 26 can comprise one or more electrically conductive compositions, including, for example, metals, metal compounds (such as, for example, silicides) and/or conductively doped silicon. Insulative cap 28 can comprise any suitable electrically insulative material, or combination of materials, and in particular aspects will comprise, consist essentially of, or consist of one or both of silicon nitride and silicon dioxide.

Each of wordlines 16, 18, 20 and 22 comprises an opposing pair of sidewalls, and anisotropically etched sidewall spacers 30 are formed along such opposing sidewalls. Sidewall spacers 30 can comprise any suitable electrically insulative material, and in particular applications will comprise, consist essentially of, or consist of silicon nitride.

Wordlines 18 and 20 are incorporated into transistor constructions 32 and 34 in the shown cross-section of FIG. 1. Specifically, wordline 18 comprises a transistor gate which gatedly connects a pair of source/drain regions 36 and 38; and wordline 20 comprises a transistor gate which gatedly connects source/drain region 38 with another source/drain region 40. The source/drain regions 36, 38 and 40 are illustrated as conductively-doped diffusion regions extending into substrate 12. Regions 36, 38 and 40 can comprise n-type doped regions and/or p-type doped regions. The source/drain regions are shown comprising doped regions 42 extending deeply within substrate 12, and lightly-doped regions 44 extending less deeply within substrate 12.

Electrically conductive pedestals 46, 48 and 50 are shown formed over source/drain regions 36, 38 and 40, respectively. Pedestals 46, 48 and 50 can comprise any suitable electrically conductive material. In particular aspects, the pedestals will comprise a lower portion of conductively-doped epitaxially grown semiconductor material, such as, for example, conductively-doped epitaxially grown silicon, and an upper portion of non-epitaxially grown material, which can include, for example, one or more of metal, metal compound and/or conductively-doped semiconductive material, (such as, for example, conductively-doped silicon). Pedestals 46, 48 and 50 have uppermost surfaces 47, 49 and 51, respectively.

Wordlines 16, 18, 20 and 22 extend through an electrically insulative material 52. The insulative material 52 is generally primarily around the outside of a memory array, and accordingly would be primarily outside of the shown region. Electrically insulative material 52 can comprise any suitable material, including, for example, doped or undoped silicon oxides, such as, for example, borophosphosilicate glass (BPSG). In the shown aspect of the invention, the insulative material 52 comprises an uppermost surface 53 which is planarized to about the same level as uppermost surfaces 47, 49 and 51 of the conductive pedestals, with such planarized surface being at about the same level as the uppermost surfaces of insulative caps 28 of the wordlines 16, 18, 20 and 22. The planarization of uppermost surfaces 47, 49, 51 and 53 can be accomplished by, for example, chemical-mechanical polishing. The planarized surfaces can be exactly level with one another. Alternatively, the planarized surfaces can be somewhat out of level with one another due to, for example, differences in rates of removal of the various materials utilized in the different surfaces.

In processing described below, capacitor storage nodes are formed in electrical connection with surfaces 47 and 51 of pedestals 46 and 50; and a bitline is formed in electrical connection with surface 49 of pedestal 48. Accordingly, surfaces 47 and 51 can be referred to as storage node contact locations, and surface 49 can be referred to as a bitline contact location. Also, the source/drain regions 36 and 40 which are ohmically connected with pedestals 46 and 50 can be referred to as storage node contact source/drain regions, and the source/drain region 38 which is ohmically connected with pedestal 48 can be referred to as a bitline contact source/drain region. Thus, the source/drain regions gatedly connected in transistor construction 32 can be referred to as a bitline contact source/drain region 38 and a storage node contact source/drain region 42; and the source/drain regions gatedly connected in transistor construction 34 can be referred to as a bitline contact source/drain region 38 and a storage node contact source/drain region 40. It is noted that the bitline contact source/drain regions may or may not be compositionally identical to the storage node contact source/drain regions.

FIG. 2 shows that the bitline contact formed by the combination of source/drain region 38 and pedestal 48 is part of an array of bitline contacts, with the other conductive pedestals of the bitline contact array being labeled 60 and the other source/drain regions of the bitline contact array being labeled 58. Pedestals 60 have upper surfaces 61 which are substantially coplanar with the upper surface 49 of pedestal 48.

FIG. 3 shows that the storage node contact comprising source/drain region 40 and pedestal 50 is part of an array of storage node contacts, with the other pedestals of the source/drain contact array being labeled 62 and the other source/drain regions of the source/drain contact array being labeled 64. Pedestals 62 have upper surfaces 63 which are substantially coplanar with the upper surface 51 of pedestal 50.

Figure 4:
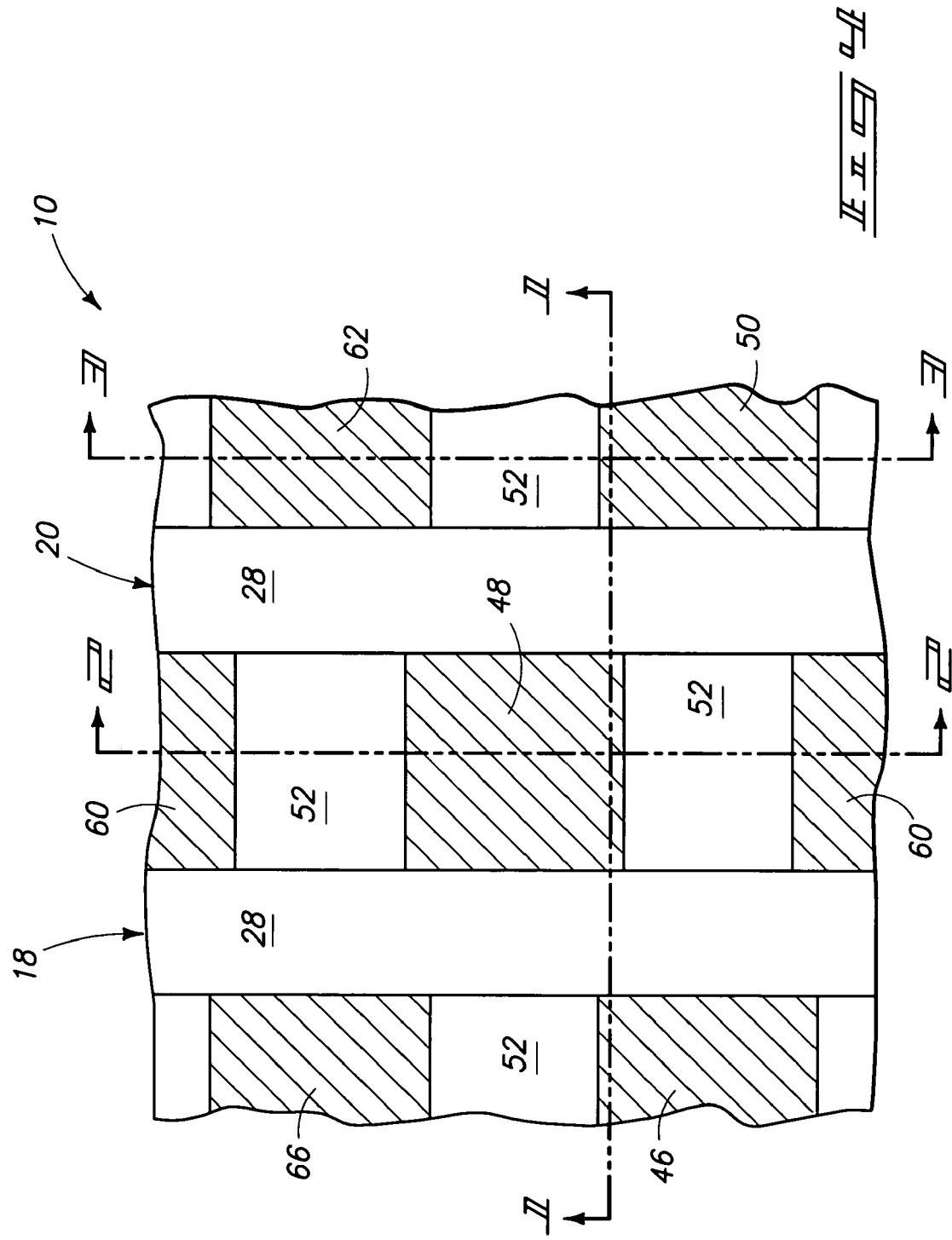
FIG. 4 is a diagrammatic top view of exemplary semiconductor wafer fragment illustrating the locations of the fragments of FIGS. 1, 2 and 3 along the lines 1—1, 2—2 and 3—3, respectively.

FIG. 4 shows an exemplary orientation of pedestals 46, 48 and 50 relative to one another, and also shows that pedestal 46 would, like pedestal 50, be part of an array of storage node contact locations and would extend within a column or row of such locations. Another storage node contact location within the same illustrated column as location 46 is labeled as 66 in the illustration of FIG. 4.

Figure 5:
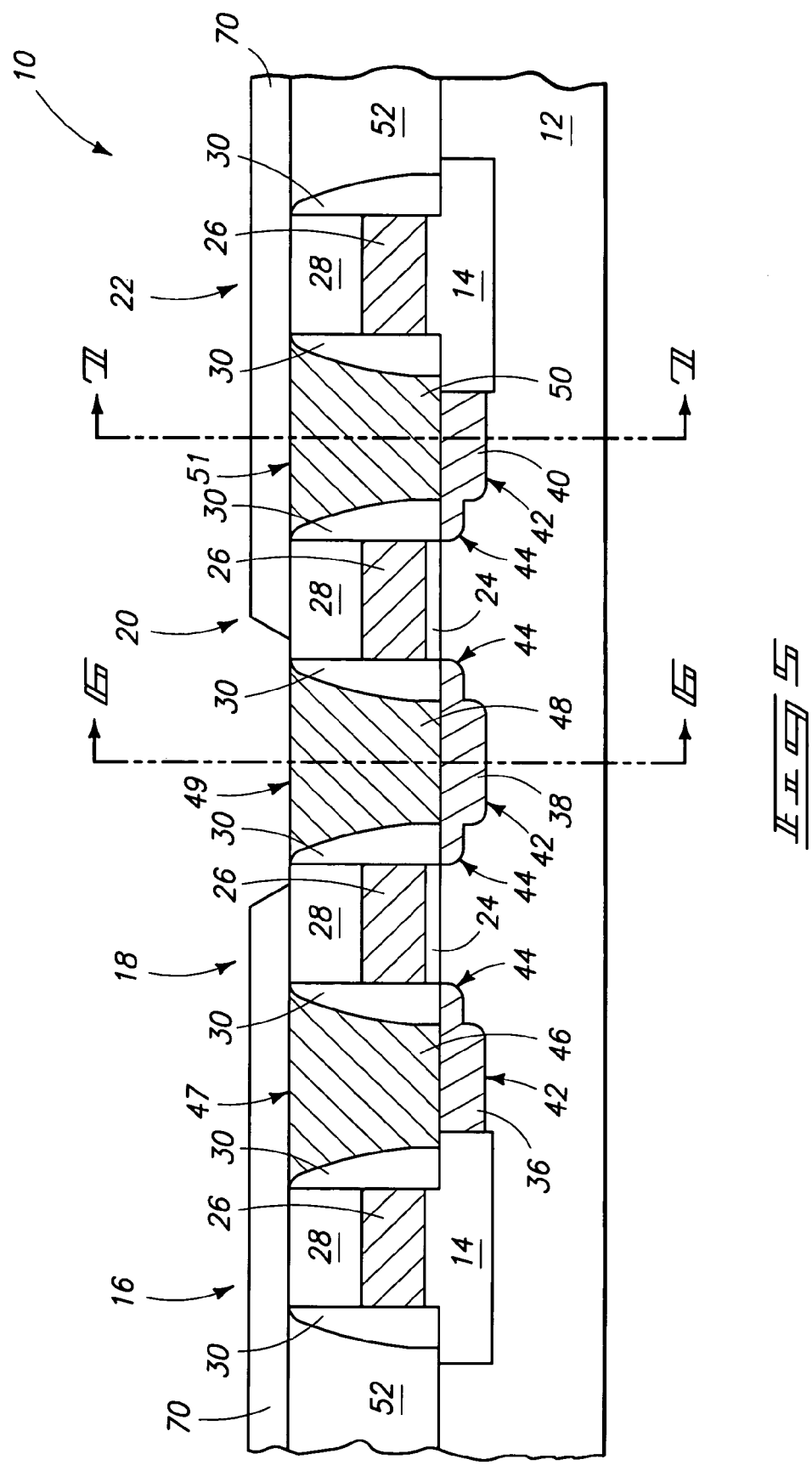
FIGS. 5–7 are views of the cross-sectional fragments of FIGS. 1–3, respectively, shown at a processing stage subsequent to that of FIGS. 1–3. The views of FIGS. 6 and 7 are along the lines 6—6 and 7—7 of FIG. 5, and the view of FIG. 5 is along the lines 5—5 of FIGS. 6 and 7.
Figure 6:
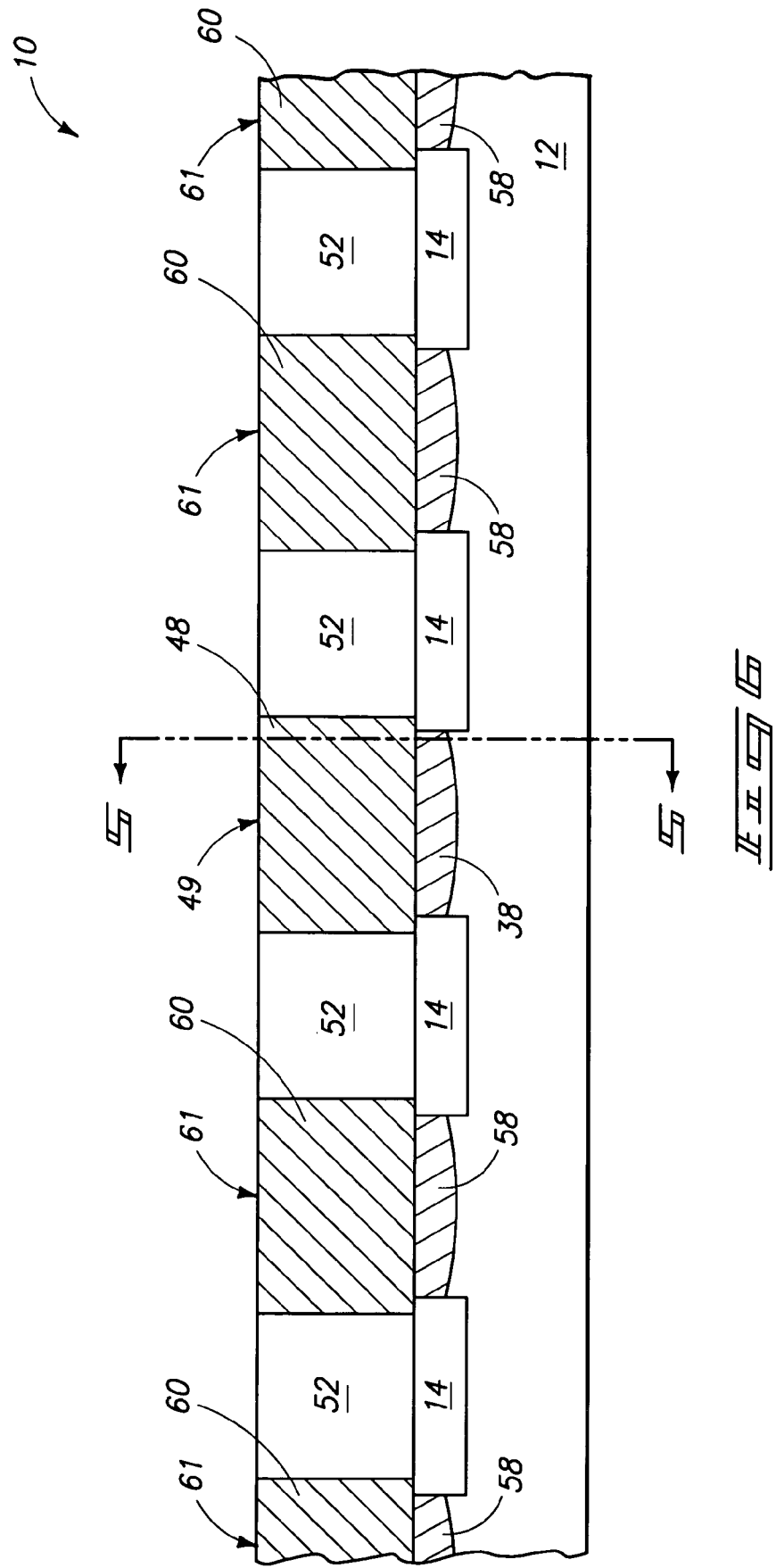
Figure 7:
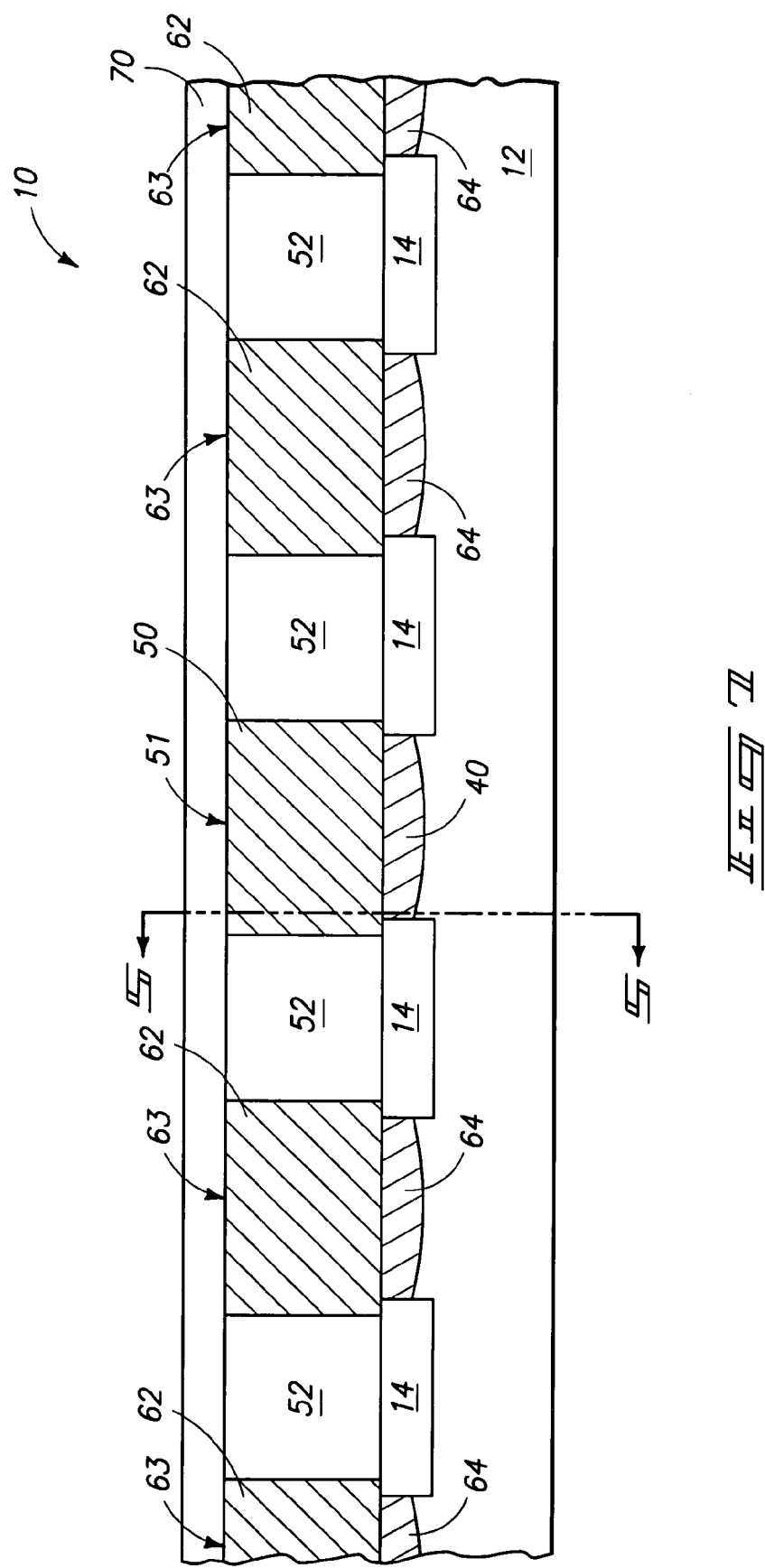

Referring next to FIGS. 5–7, a patterned etch stop 70 is formed over the storage node contact locations (specifically, the locations 47, 51 and 63 corresponding to the uppermost surfaces of pedestals 46, 50 and 62). The patterned etch stop covers the storage node contact locations, but does not cover the bitline contact locations (specifically, the locations 49 and 61 corresponding to the uppermost surfaces of pedestals 48 and 60). The etch stop 70 would be visible in the view of FIG. 6 as being behind the plane of the cross-section and specifically behind the opening extending to pedestals 48 and 60. The etch stop 70 is not shown in FIG. 6 to simplify the drawing and to emphasize that the etch stop 70 is not over pedestals 48 and 60.

In particular aspects, the bitline contact locations can be considered to correspond to a first set of conductive nodes and the storage node contact locations can be considered to correspond to a second set of conductive nodes. In such aspects, the patterned etch stop can be considered to cover the second set of conductive nodes while having openings extending through it to the first set of conductive nodes.

Etch stop 70 can be patterned into the desired shape utilizing any appropriate method. In particular aspects, layer 70 can be initially formed entirely across the substrate and then selected portions of the layer can be subsequently removed with an appropriate etch to pattern the layer. Photolithographic processing can be used to form a mask (not shown) over the layer 70 which defines the selected portions which are removed with the etch.

Patterned etch stop 70 can comprise any suitable dielectric material having appropriate etching properties. In particular aspects, etch stop 70 can comprise, consist essentially of, or consist of aluminum oxide. Additionally, or alternatively, etch stop 70 can comprise, consist essentially of, or consist of silicon and one or both of oxygen and nitrogen. For instance, etch stop 70 can comprise, consist essentially of, or consist of silicon dioxide, silicon nitride, and/or silicon oxynitride. If etch stop 70 comprises silicon dioxide, such can be undoped. Specifically the silicon dioxide can comprise no detectable boron and phosphorus therein. The etch stop layer can therefore, in some aspects comprise, consist essentially of, or consist of an undoped oxide.

In the shown aspect of the invention, patterned etch stop 70 is elevationally above wordlines 16,18, 20 and 22, and accordingly is elevationally above the transistor gates formed from wordlines 18 and 20. Etch stop 70 is shown to physically contact electrically insulative caps 28 of wordline stacks 16, 18, 20 and 22, and further is shown to contact sidewall spacers 30.

Figure 8:
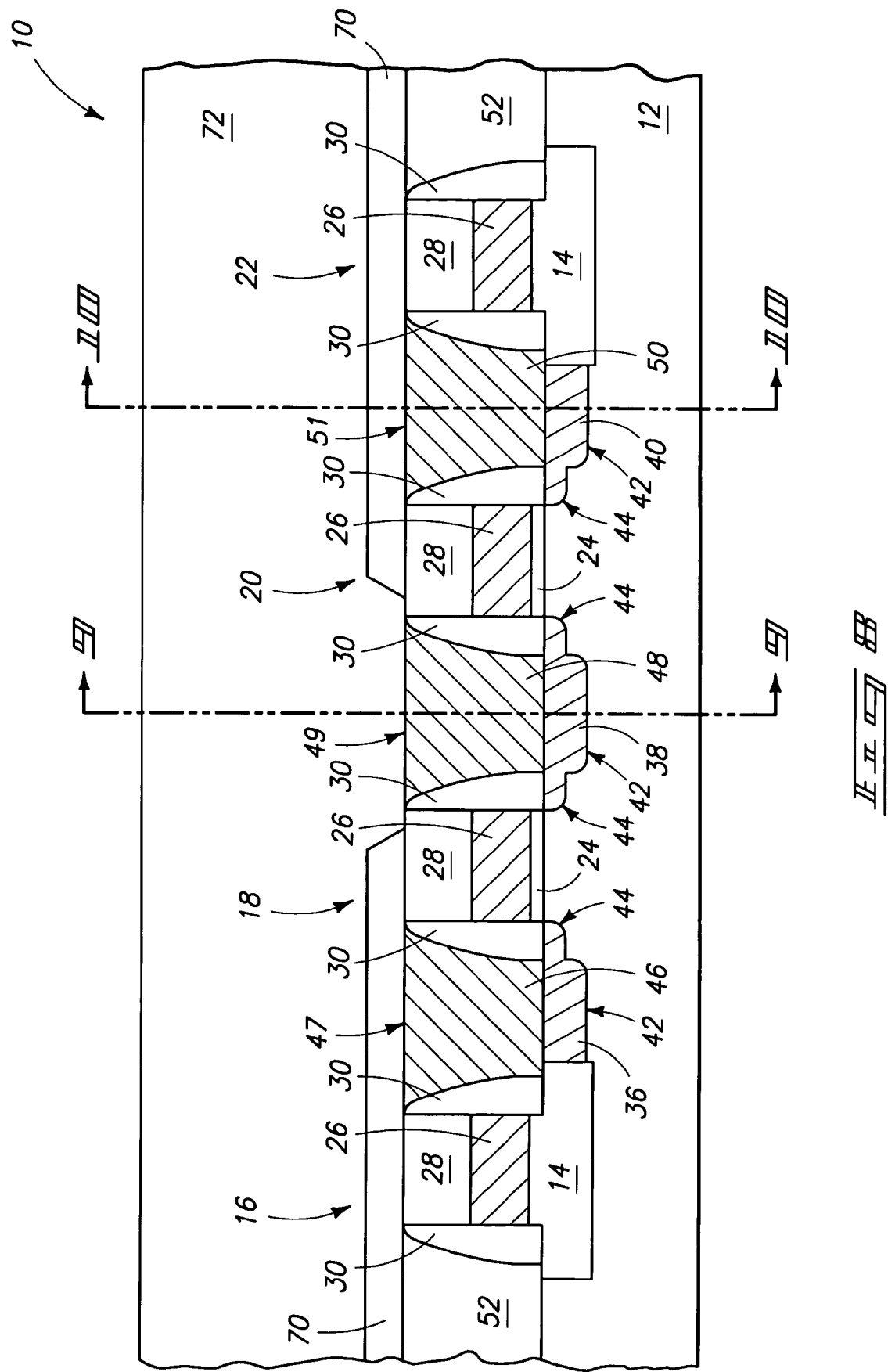
FIGS. 8–10 are views of the cross-sectional fragments of FIGS. 1–3, respectively, shown at a processing stage subsequent to that of FIGS. 5–7. The cross-sections of FIGS. 9 and 10 are along the lines 9—9 and 10—10 of FIG. 8, and the cross-section of FIG. 8 is along the lines 8—8 of FIGS. 9 and 10.
Figure 9:
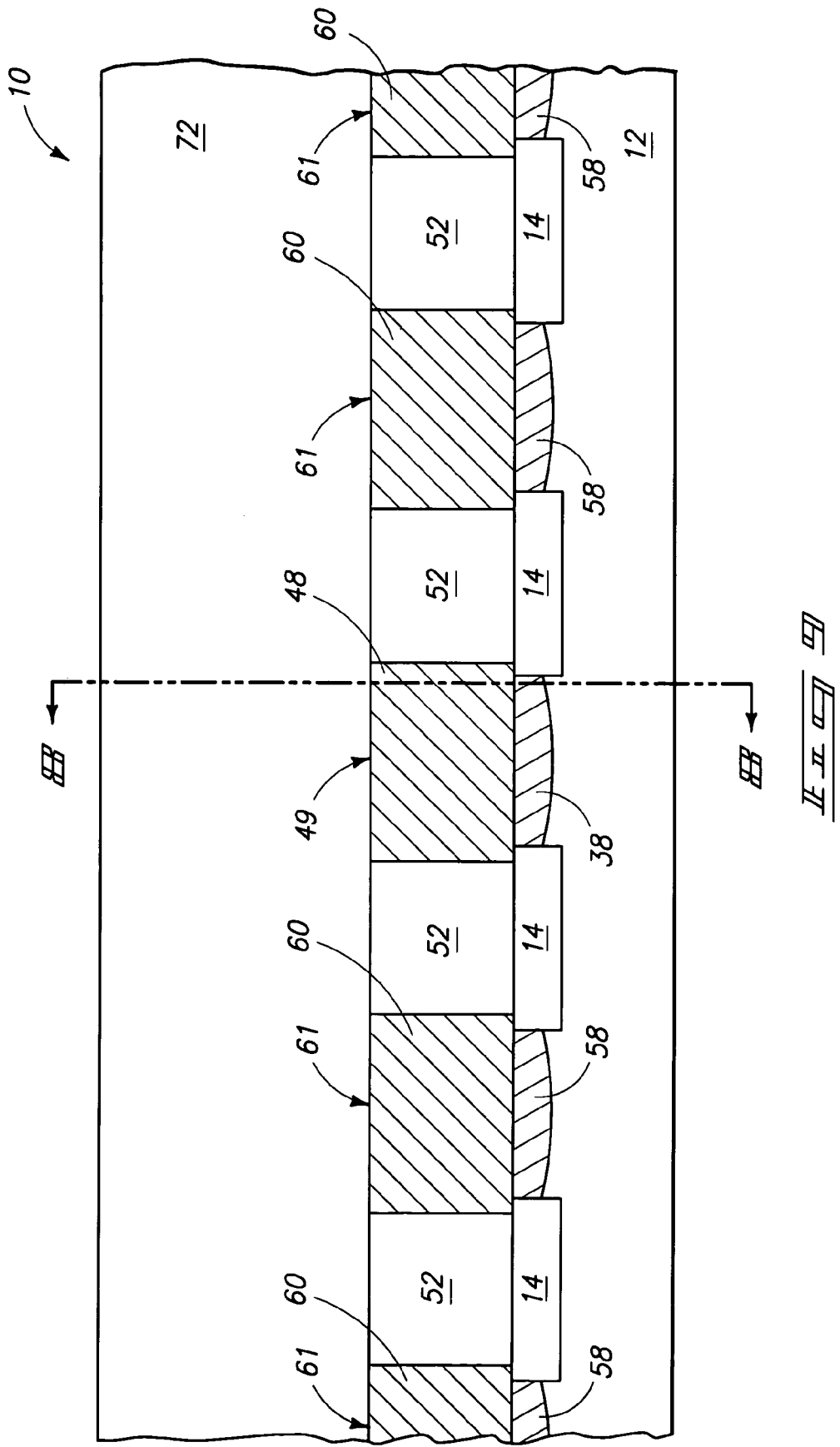
Figure 10:
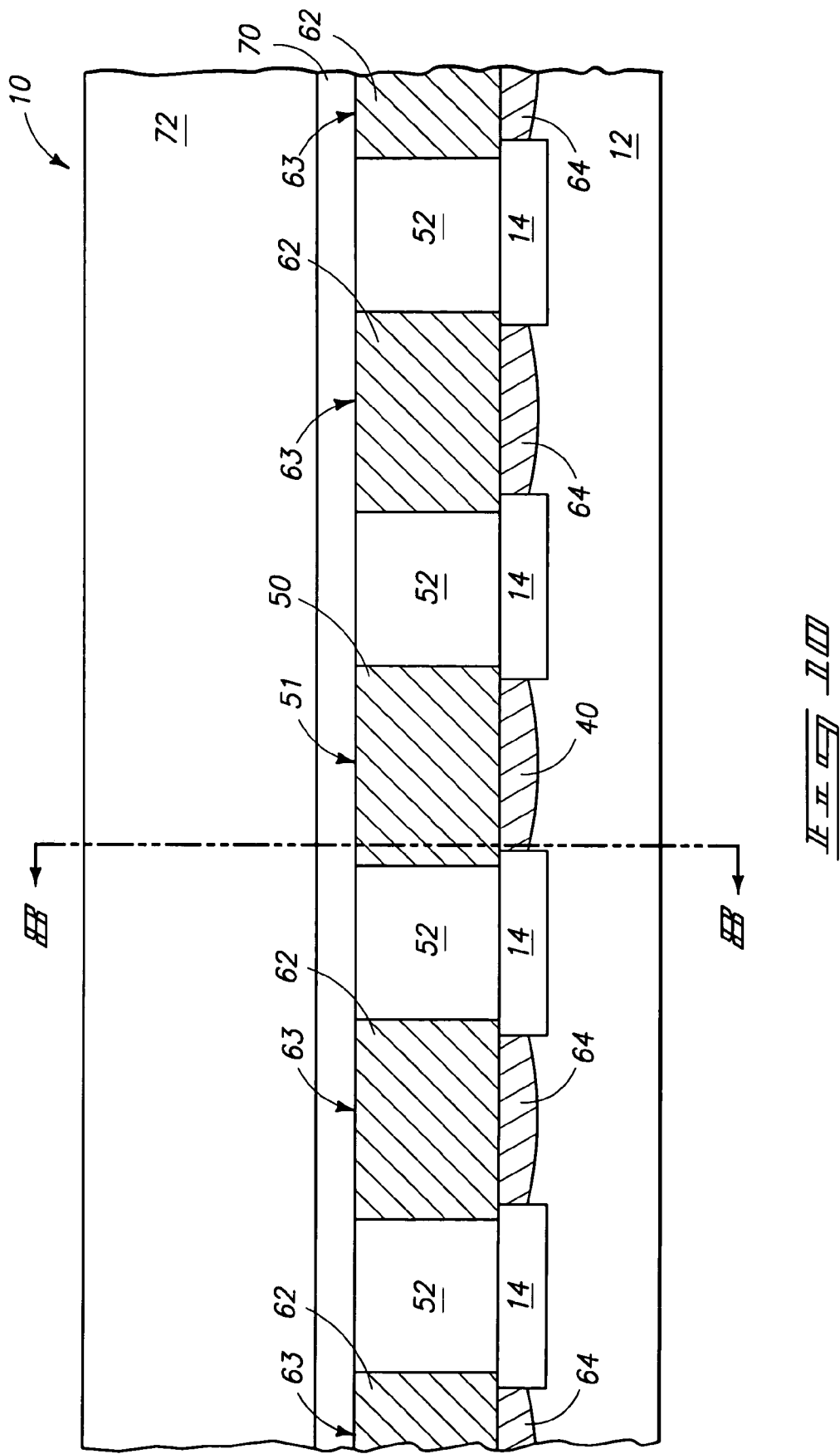

Referring next to FIGS. 8–10, an electrically insulative material 72 is formed over patterned etch stop 70, as well as over the bitline contact locations 49 and 61. Material 72 is shown having a planarized upper surface.

Insulative material 72 can comprise a single homogeneous composition, or can comprise a plurality of layers. Insulative material 72 can, in some aspects, be referred to as an insulative mass. Material 72 is a material which can be selectively etched relative to etch stop 70. In particular aspects, etch stop 70 and layer 72 can be referred to as a first electrically insulative material and a second electrically insulative material, respectively.

Insulative material 72 can comprise any suitable electrically insulative composition, or combination of compositions. In particular aspects, insulative material 72 will comprise, consist essentially of, or consist of one or both of a low-k dielectric material and a doped silicon oxide. Low-k dielectric materials are any materials having a dielectric constant less than that of silicon dioxide. Insulative material 72 can be, in some aspects, a silicon oxide which is more doped than a silicon oxide used for etch stop 70. Exemplary doped silicon oxides are BPSG, PSG and fluorinated glass.

Figure 11:
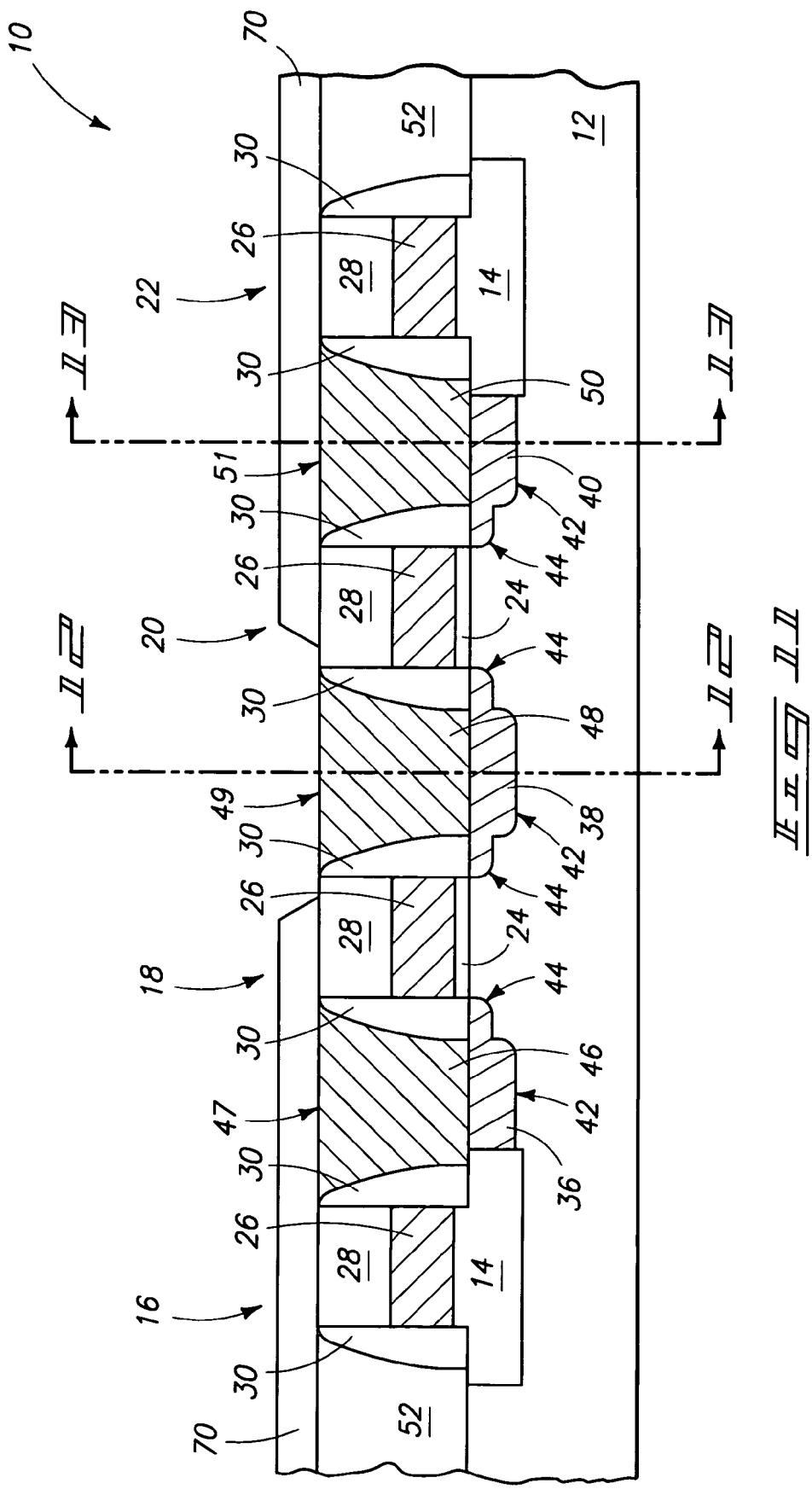
Figure 6H:
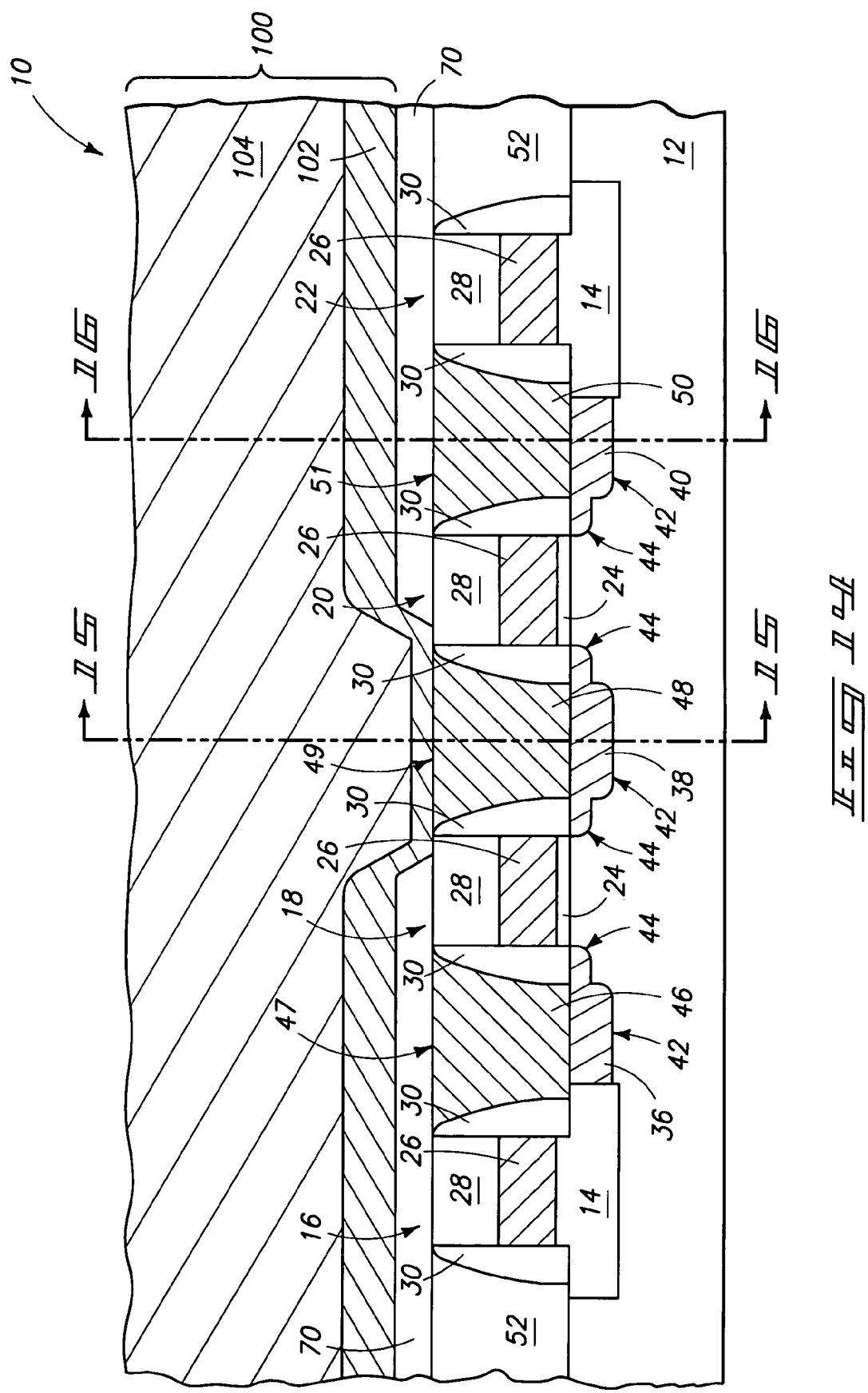

Referring next to FIGS. 11–13, and particularly to FIGS. 12 and 13, trenches 76, 78, 80, 82 and 84 are formed through insulative material 72. The trenches extend entirely through insulative material 72. Accordingly, the trenches extend to an upper surface of etch stop 70 and also extend to the bitline contact locations 49 and 61 exposed through patterned etch stop 70. The openings can extend to expose a conductive surface of locations 49 and 61, as shown. Alternatively, the openings can extend to a thin film of insulative material (such as a film of native oxide formed over conductively-doped silicon of locations 49 and 61) which can be removed in subsequent processing.

The location of the trenches can be defined by appropriate photolithographic processing utilizing a patterned photoresist mask (not shown) and an appropriate etch of material 72. The photoresist mask can be removed after the trenches are formed. Typically, layer 72 will have a thickness of from about 100 nanometers to about 500 nanometers, and an appropriate etch can be chosen for the trench formation such that the trenches have the shown "V" shape. Thus, the bottom of the trenches is formed to be narrower than the top of the trenches. The slope of the sidewalls of the trenches can be, for example, about 85° plus or minus 2° relative to a vertical line (not shown). The shown "V" shape of the trenches can be advantageous in further processing (described below) in that materials formed at the top of the trenches will have a wider lateral periphery than materials formed at the bottom of the trenches.

The only trench visible in FIG. 11 is trench 80, and the upper surface of the construction of FIG. 11 basically corresponds to a bottom surface of trench 80. The insulative material 72 corresponding to a sidewall of trench 80 would be visible in the view of FIG. 11 as being behind the plane of the cross-section and specifically behind the opening corresponding to trench 80. The material 72 of the trench 80 sidewall is not shown in FIG. 11 to simplify the drawing.

FIG. 11 shows that the etch utilized to form the trench stops on etch stop 70, stops on the material of insulative caps 28 and sidewalls 30 (such material would typically be silicon nitride), and also stops on the conductive upper surface 49 of pedestal 48. A suitable etch can be chosen for selectively etching insulative material 72 relative to conductive material 48, insulative materials 28 and 30, and insulative material 70. In particular aspects, insulative material 72 can consist essentially of, or consist of doped oxide; layer 70 can consist essentially of, or consist of undoped oxide (or consist of an oxide less doped than the oxide of material 72); materials 28 and 30 can consist essentially of, or consist of silicon nitride; and upper surface 49 can consist essentially of, or consist of metal or doped semiconductive material.

In particular applications, appropriate local interconnects can be formed to one or more of the wordlines 16, 18, 20 and 22 during the patterning of the openings through layer 70 (discussed above with reference to FIGS. 5–7) and/or during the patterning of the trenches through layer 72.

The insulative material 72 remaining after formation of the trenches has an uppermost surface 90 and sloped sidewall surfaces 92 extending into the trenches.

Construction 10 can be exposed to appropriate cleaning to clean the surfaces exposed after formation of the trenches through material 72, and such cleaning can prepare the exposed surfaces for subsequent adhesion of conductive materials formed thereover.

Figure 16:
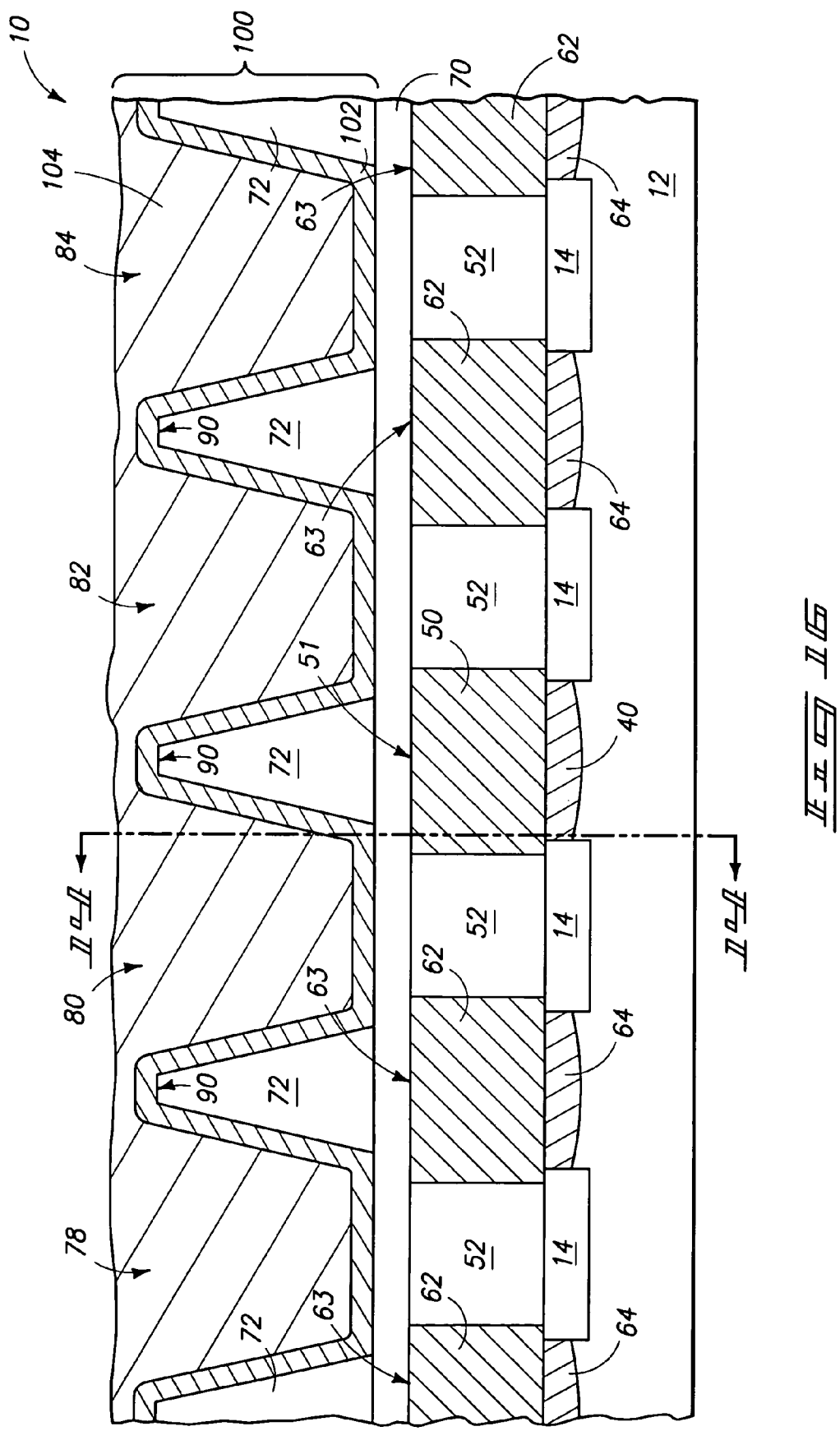

Referring to FIGS. 14, 15 and 16, a stack 100 of electrically conductive material is formed within trenches 76, 78, 80, 82 and 84, and also over upper surfaces 90 of insulative material 72. Stack 100 comprises a thin adhesive composition 102 and a bulk composition 104. Either or both of the adhesive and bulk compositions can comprise multiple layers or can be homogeneous. In particular aspects, the adhesive composition can comprise, consist essentially of, or consist of a layer of elemental titanium over a layer of titanium nitride and/or tungsten nitride; and the bulk material 104 can comprise, consist essentially of, or consist of elemental tungsten. Accordingly, stack 100 can be a three-layer stack, with one of the layers being tungsten nitride or titanium nitride, the next layer being titanium, and the upper bulk layer being tungsten. In other aspects, the adhesive can comprise, consist essentially of, or consist of TaN; and the bulk composition can comprise, consist essentially of, or consist of copper, provided that suitable temperatures utilized with TaN and Cu can be accommodated by other devices (not shown) which may be associated with the wafer comprising fragment 10. Additionally or alternatively, stack 100 can comprise elemental Ta.

Other conductive materials can be utilized in addition to, or alternatively to the materials discussed above for compositions 102 and 104 of stack 100, and further it is to be understood that adhesive composition 102 can be eliminated if bulk material 104 can be suitably adhered to the surfaces within trenches 76, 78, 80, 82 and 84. Conductive materials 102 and 104 can be formed by any suitable method including, for example, chemical vapor deposition, physical vapor deposition, and/or electroplating, etc. In particular aspects, adhesive material 102 can be considered to partially fill trenches 76, 78, 80, 82 and 84. In such aspects, bulk material 104 can be considered to be formed within the partially filled trenches to completely fill the trenches.

Conductive materials 102 and 104 are electrically isolated from storage node contact pedestals 46, 50 and 62 by etch stop 70, and electrically connect with bitline contact pedestals 48 and 60 through openings extending through patterned etch stop 70. In the shown aspect of the invention, conductive stack 100 physically contacts the upper surfaces of the bitline contact pedestals. Accordingly, conductive stack 100 can be considered to physically contact bitline contact locations defined by the upper surfaces of the bitline contact pedestals.

The conductive material 102 shown in FIG. 14 appears to be thicker over etch stop 70 than over pedestal 48. This is due to the cross-section of the view and not due to a change in thickness of the material 102. Such can be understood by comparing the cross-sections of FIGS. 15 and 16. The cross-section of FIG. 15 shows that the portion of the FIG. 14 view cutting through FIG. 15 perpendicularly cross-sections material 102, and the cross-section of FIG. 16 shows that the portion of the FIG. 14 view cutting through FIG. 16 obliquely cross-sections material 102.

Figure 17:
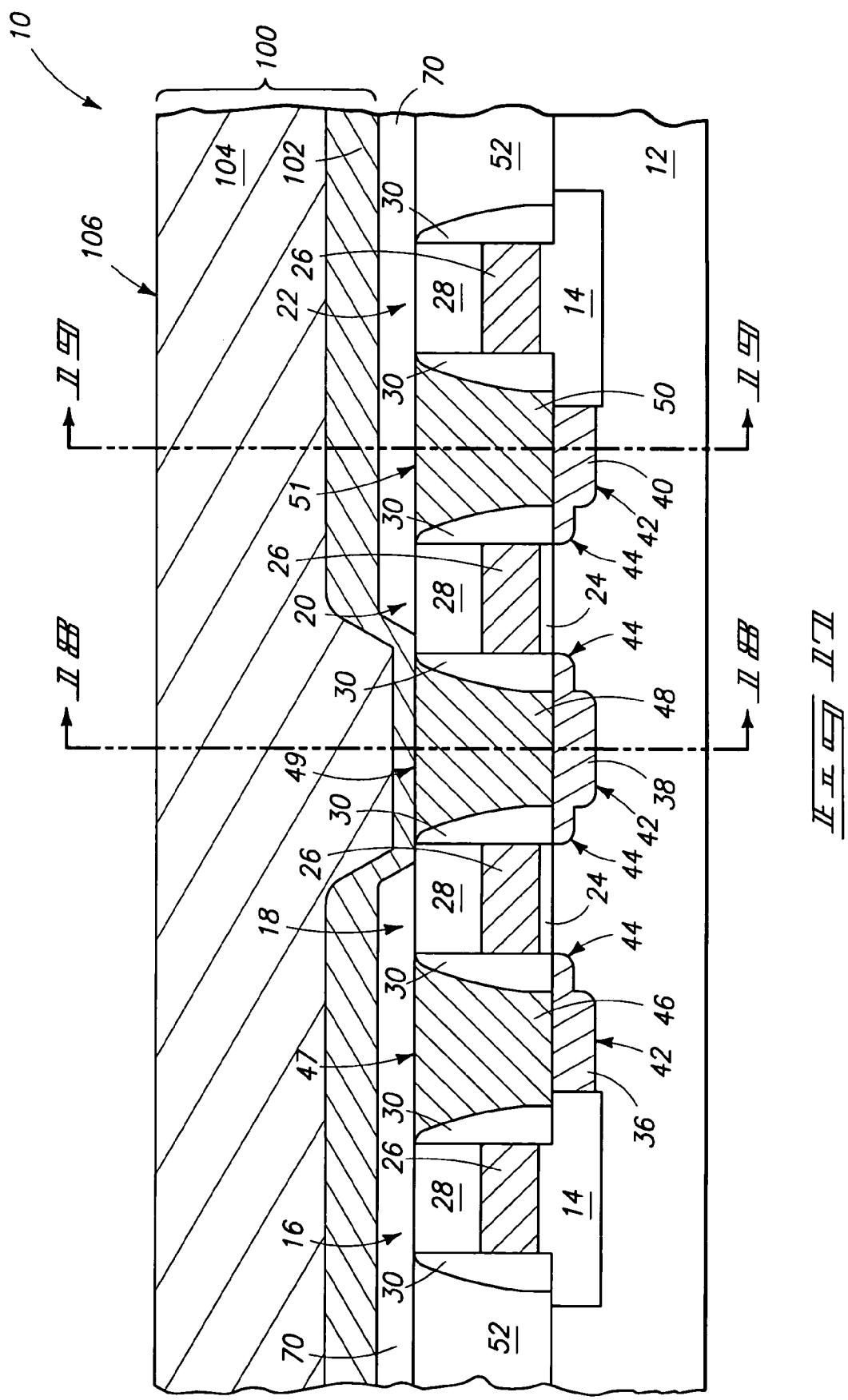
FIGS. 17–19 are views of the cross-sectional fragments of FIGS. 1–3, respectively, shown at a processing stage subsequent to that of FIGS. 14–16. The cross-sections of FIGS. 18 and 19 are shown along the lines 18—18 and 19—19 of FIG. 17, and the cross-section of FIG. 17 is shown along the lines 17—17 of FIGS. 18 and 19.
Figure 18:
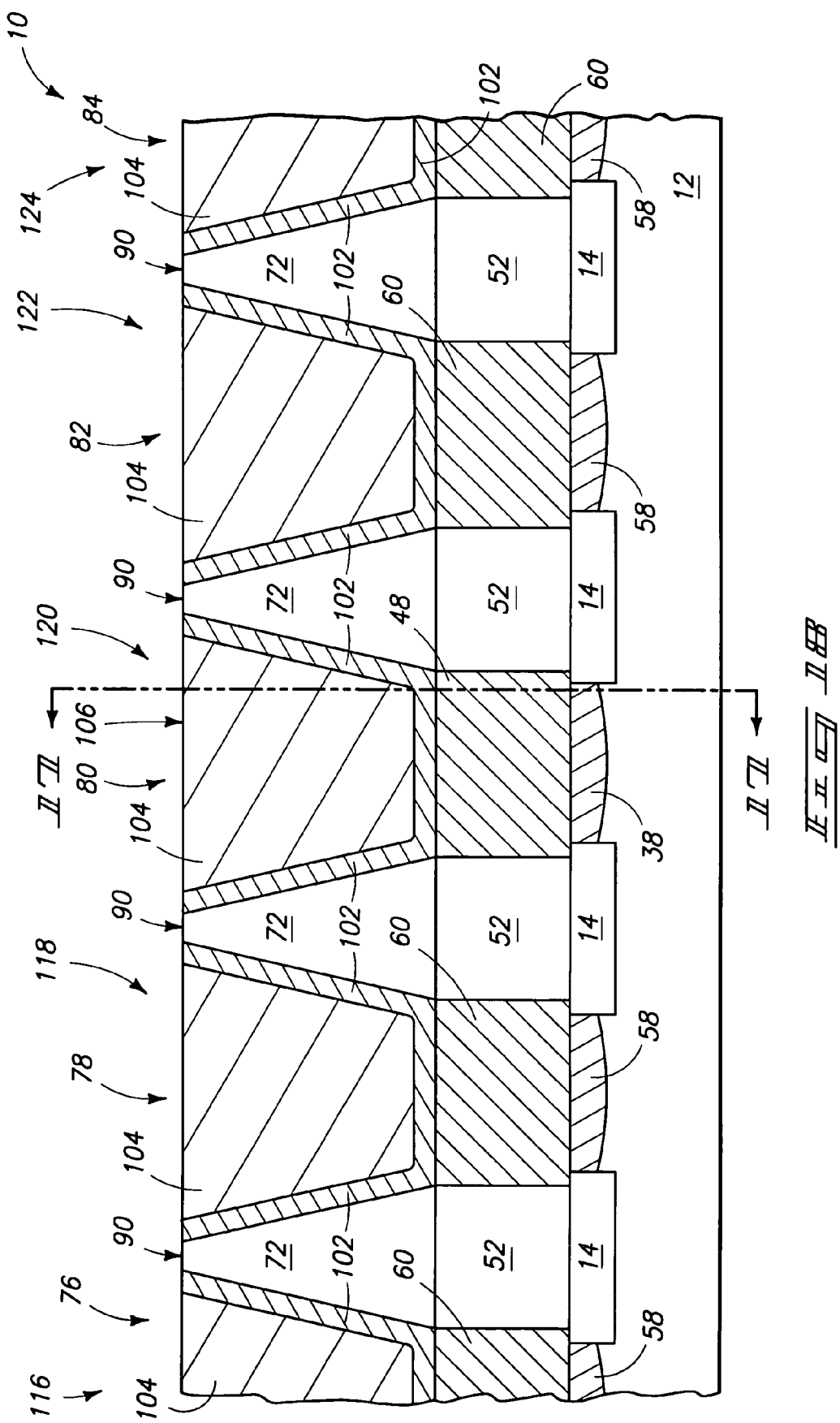
Figure 19:
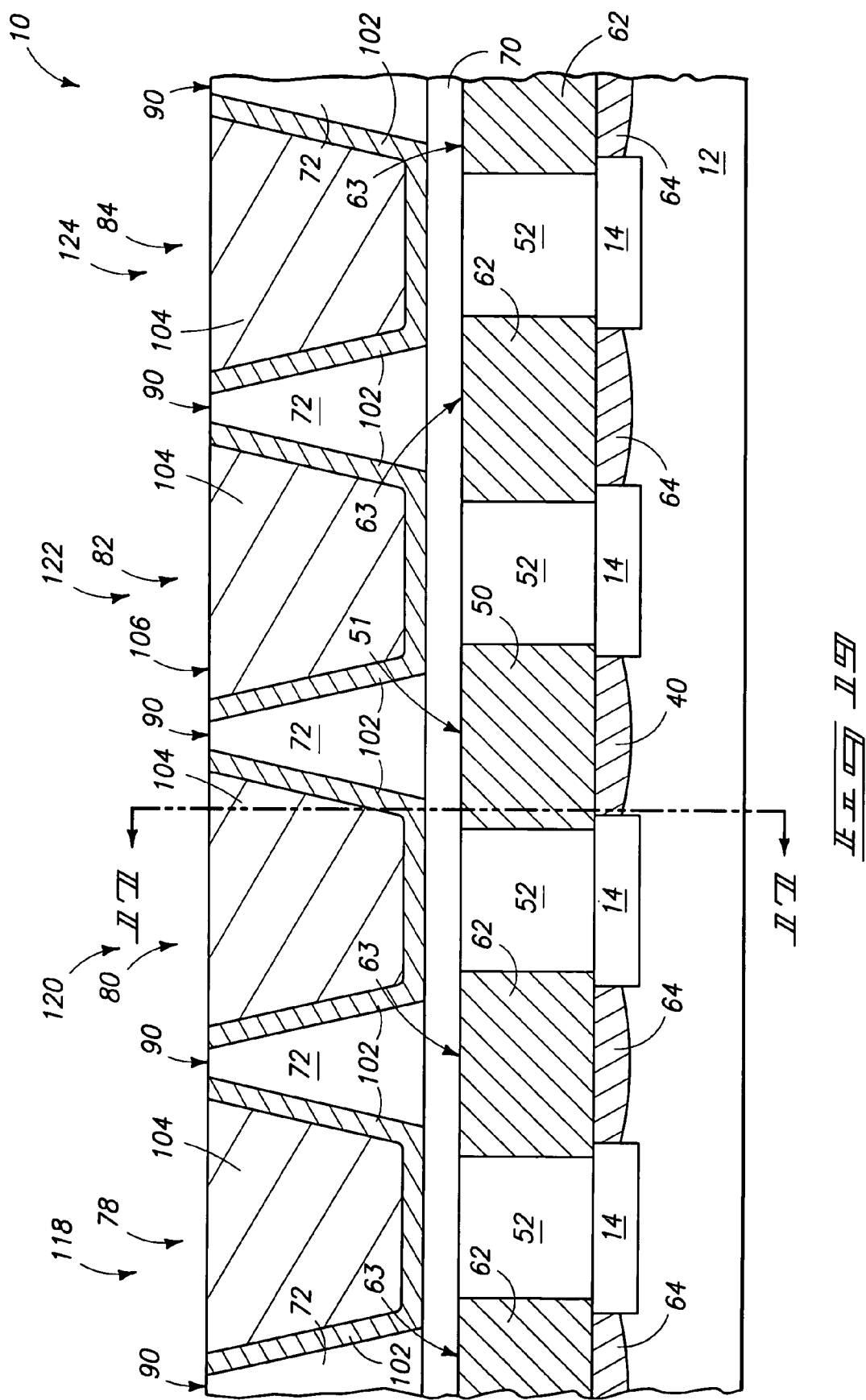

Referring to FIGS. 17–19, an upper surface of stack 100 is planarized to remove stack 100 from over uppermost surface 90 of insulative material 72. Such forms a planarized upper surface 106 of stack 100, and also forms a plurality of electrically isolated conductive lines 116, 118, 120, 122 and 124 from the conductive material within openings 76, 78, 80, 82 and 84, respectively. The planarization of the upper surface of stack 100 can be accomplished by, for example, chemical-mechanical polishing. The shown planarization forms an upper surface 106 of stack 100 which is approximately at the same level as the initial upper surface 90 of insulative material 72. It is to be understood, however, that the planarization may, in particular aspects of the invention, remove some of material 72, and accordingly the upper surface 106 and new upper surface 90 of material 72 may be elevationally below the upper surface of material 72 that existed prior to the planarization.

The conductive lines 116, 118, 120, 122 and 124 can be considered to be spaced conductive lines, in that the conductive lines are spaced from one another by insulative material 72.

Figure 20:
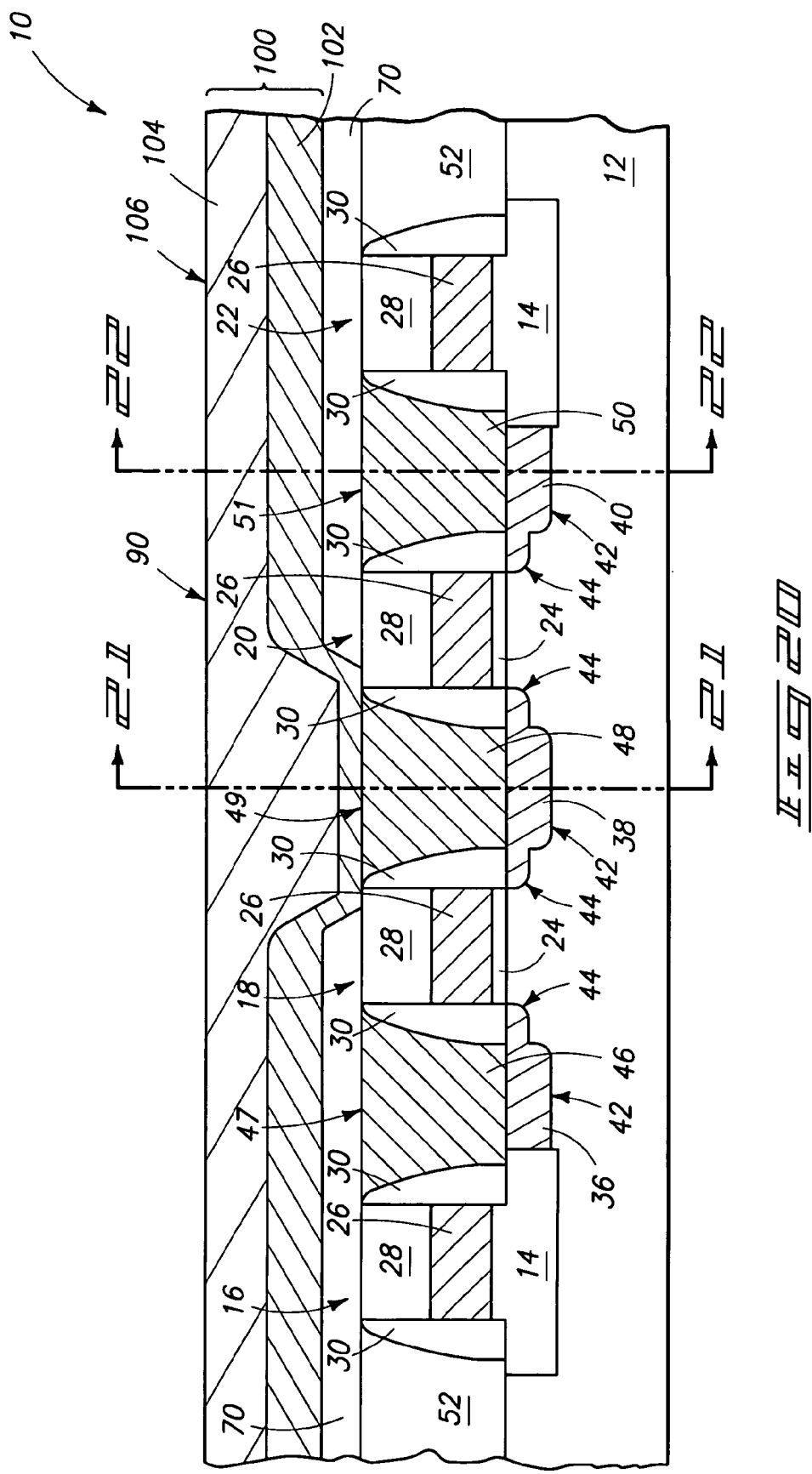
FIGS. 20–22 are views of the cross-sectional fragments of FIGS. 1–3, respectively, shown at a processing stage subsequent to that of FIGS. 17–19. The cross-sections of FIGS. 21 and 22 are shown along the lines 21—21 and 22—22 of FIG. 20, and the cross-section of FIG. 20 is shown along the lines 20—20 of FIGS. 21 and 22.
Figure 21:
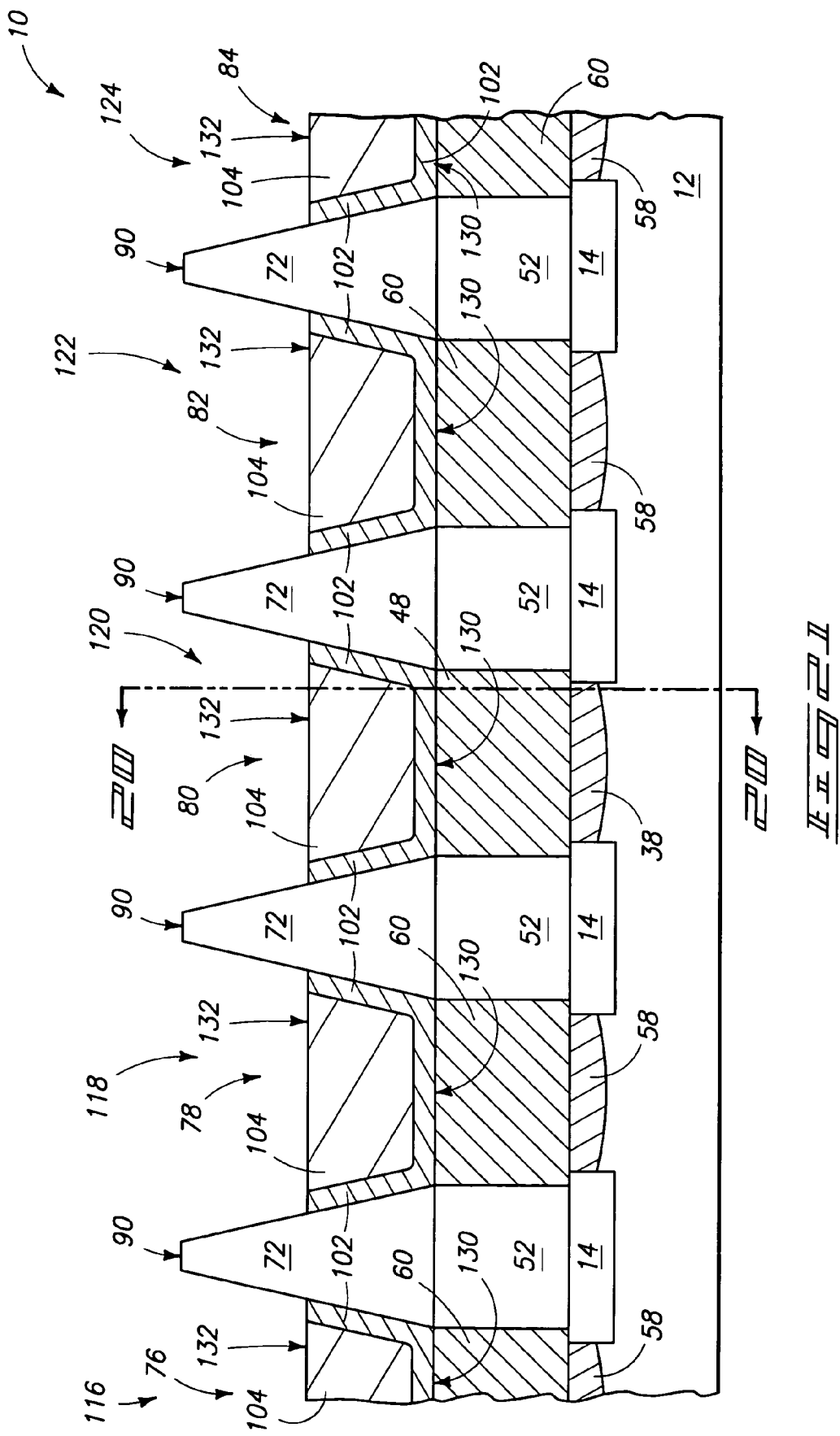
Figure 22:
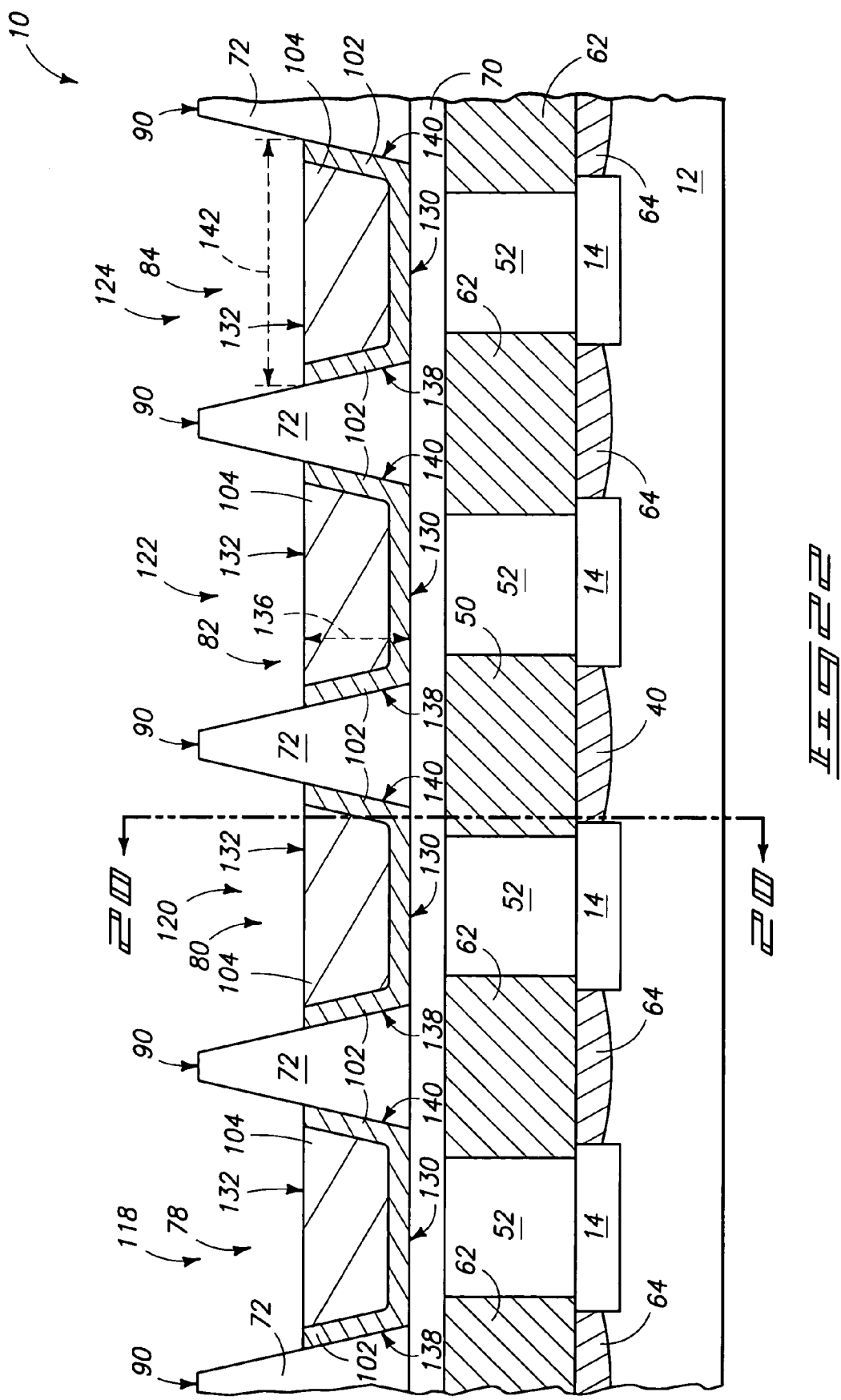

Referring next to FIGS. 20–22, an elevational height of conductive lines 116, 118, 120, 122 and 124 is reduced. Such reduction of height can be accomplished with, for example, a dry etch. In the shown aspect of the invention, the conductive lines are reduced to a height which fills approximately one-half of the depths of trenches 76, 78, 80, 82 and 84. The reduction in height of the conductive lines can be considered reduction of an amount of the conductive materials within the trenches so that the trenches become less than entirely filled with the conductive materials. The reduction in height of the conductive lines can also be considered to form second trenches over the conductive lines, with such second trenches corresponding to portions of the trenches 78, 80, 82 and 84 opened by the reduction in height of the conductive lines therein. In other words, trenches 78, 80, 82 and 84 can be considered to be first trenches, which at the processing stage of FIGS. 20–22 are partially filled with conductive material to leave openings over the conductive material within the first trenches. Such openings remaining over the conductive material within the first trenches are second trenches which extend over the conductive material, and which are entirely contained within the first trenches.

The conductive lines 116, 118, 120, 122 and 124 have bottom surfaces 130, and top surfaces 132, and a height 136 extending between the top and bottom surfaces. The height 136 is shown for conductive line 122 only, and is shown only in FIG. 22. The height will vary along the conductive lines for at least the reason that the conductive lines are thicker over bitline contact locations (such as the locations shown in FIG. 23) than over etch stop 70, but such minor variation in height does not affect the discussion that follows.

The conductive lines comprise sloped lateral surfaces 138 and 140 in opposing relation to one another. Additionally, the conductive lines comprise a lateral width 142 which extends between the lateral surfaces 138 and 140 at the widest point, which in the shown application corresponds to the uppermost surface of the conductive lines. The lateral width 142 is shown only for conductive line 124, and is shown only in FIG. 22. The lateral width can vary along the conductive lines for at least the reason that the conductive lines are thicker over bitline contact locations (such as the locations shown in FIG. 23) than over etch stop 70 and accordingly can have a wider lateral width over the bitline contact locations than over the etch stop, but such minor variation in lateral width does not affect the discussion that follows.

Figure 23:
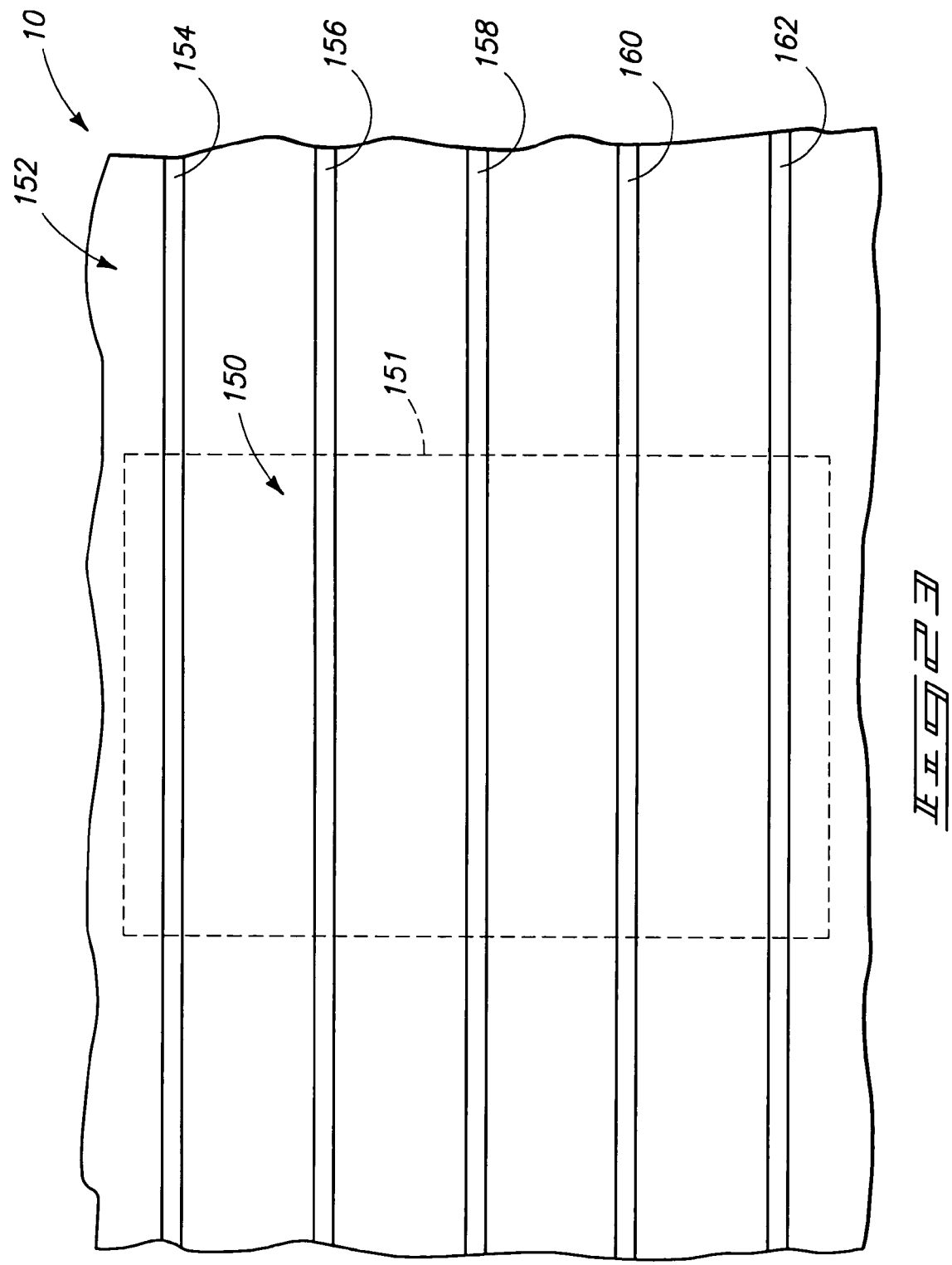
FIG. 23 is a diagrammatic top view of a semiconductor wafer fragment shown at the processing stage of FIGS. 20–22, and diagrammatically illustrating that an exemplary wafer fragment can comprise a memory array region and a region peripheral to the memory array region.

Referring to FIG. 23, an upper surface of a wafer fragment comprising construction 10 is diagrammatically illustrated. Although the layout is shown comprising a pattern of straight lines, it is to be understood that other patterns can be utilized, including, for example, a weaving pattern for a $6F^2$ cell arrangement. The wafer fragment of FIG. 23 is shown to comprise a memory array region (for example, a DRAM array region) 150 and a region 152 peripheral to the memory array region. A dashed line 151 is utilized to demarcate a boundary between the memory array region 150 and the peripheral region 152. Lines 154, 156, 158, 160 and 162 are shown traversing across the memory array region 150 as well as across the peripheral region 152. Lines 154, 156, 158, 160 and 162 can correspond to conductive lines similar to the lines 116, 118, 120, 122 and 124 discussed above, and formed in accordance with the methodology described with reference to FIGS. 1–22. The lines 154, 156, 158, 160 and 162 will ultimately be bitline interconnects.

One aspect of the invention is the recognition that it can be advantageous to have bitline interconnects which are thicker across peripheral region 152 than across memory array region 150. The thick lines of FIGS. 17–19 can be formed identically across memory array region 150 and peripheral region 152. The lines across peripheral region 152 can then be protected with a mask so that the thinning of the line thicknesses shown in FIGS. 20–22 is applied only over portions of the lines extending across memory array region 150. The protective mask can be any suitable material, including, for example, photolithographically patterned photoresist. The result of protecting lines 154, 156, 158, 160 and 162 across peripheral region 152 while thinning the lines across memory array region 150 is that the lines will have the desired increased thickness in peripheral region 152 relative to memory array region 150. Such can allow the lines to have a low sheet rho (resistance), which can be desired for forming local interconnects to the lines.

Figure 24:
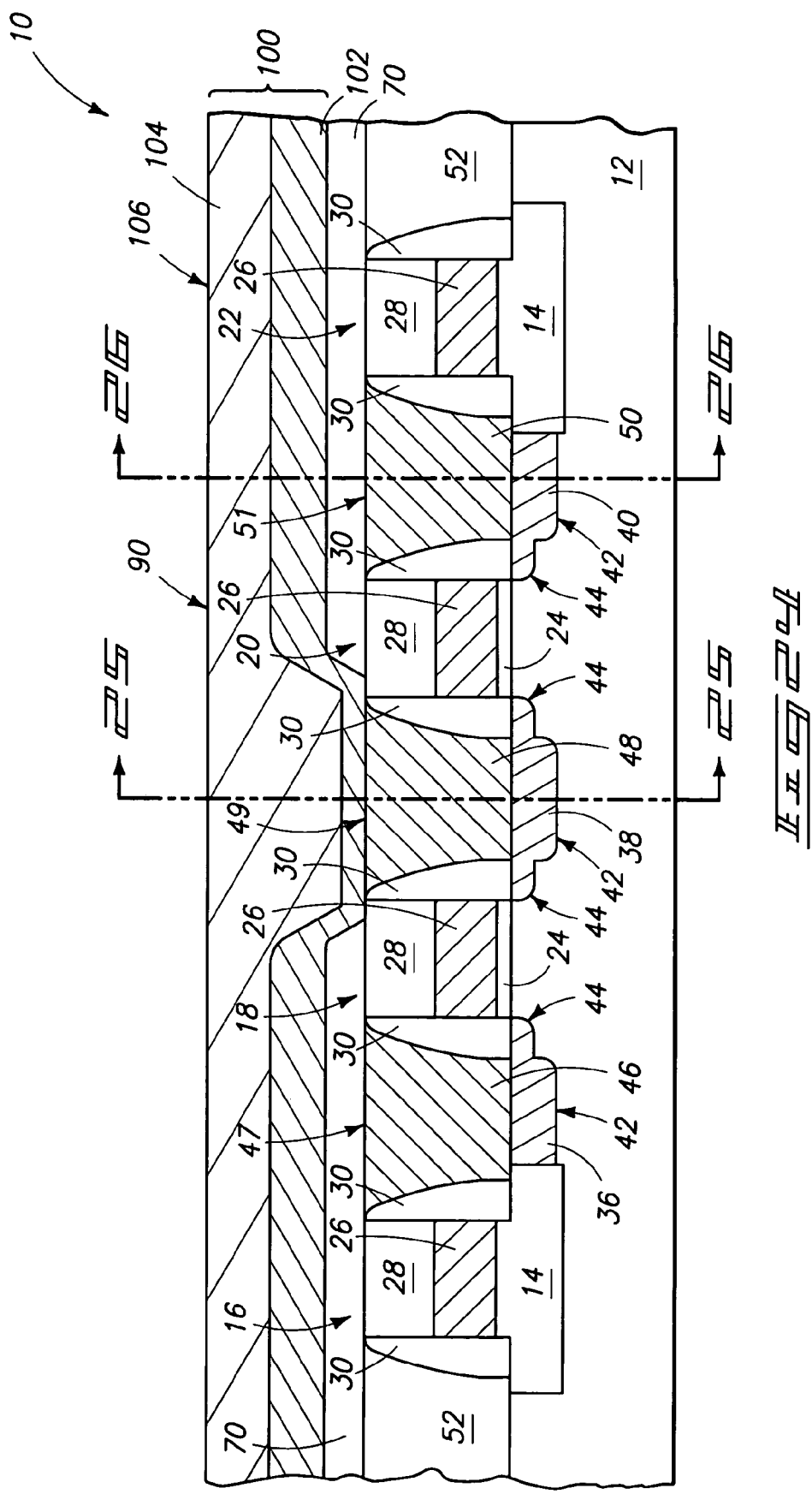
FIGS. 24–26 are views of the cross-sectional fragments of FIGS. 1–3, respectively, shown at a processing stage subsequent to that of FIGS. 20–22. The cross-sections of FIGS. 25 and 26 are shown along the lines 25—25 and 26—26 of FIG. 24, and the cross-section of FIG. 24 is shown along the lines 24—24 of FIGS. 25 and 26.
Figure 25:
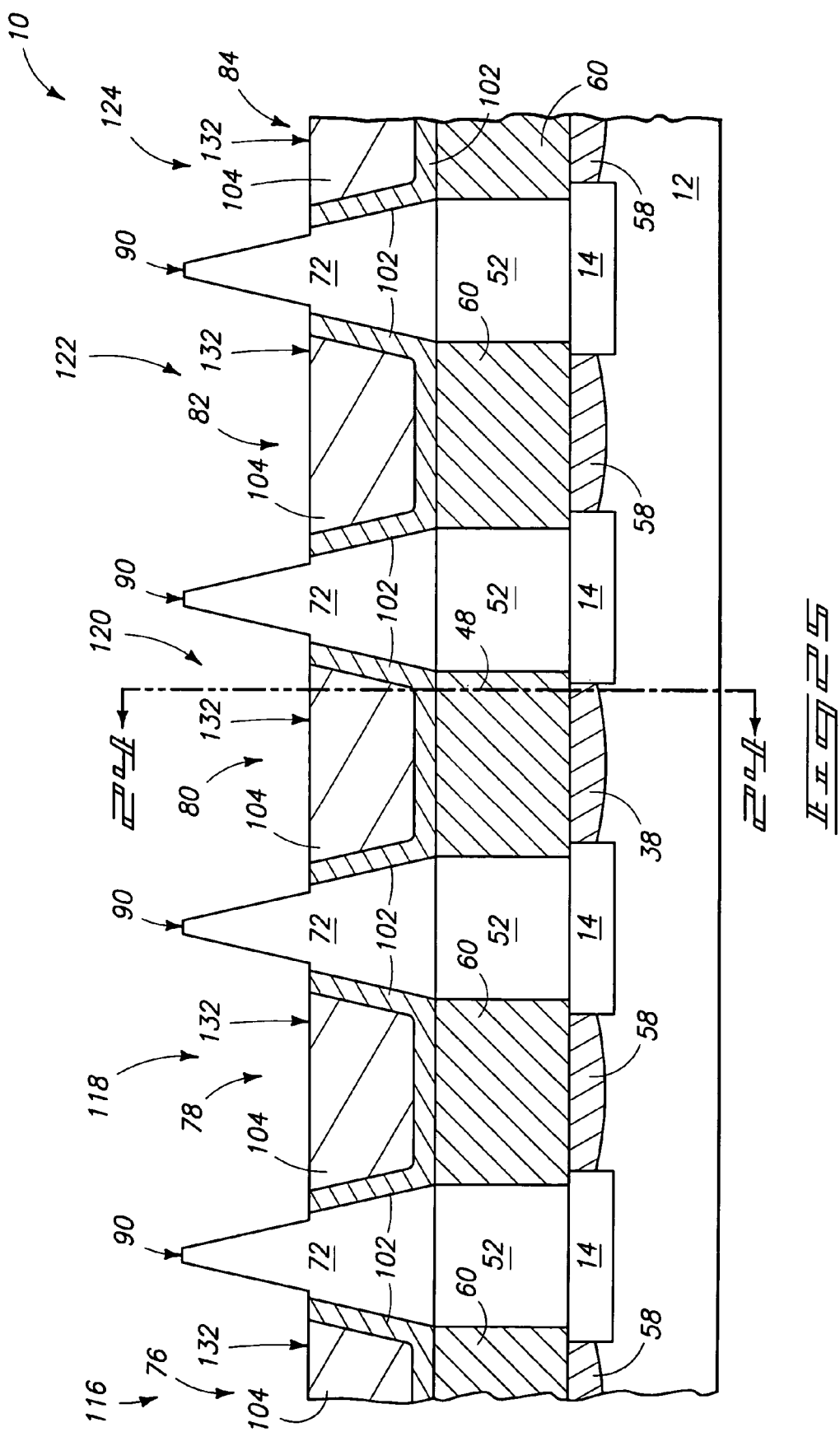
Figure 26:
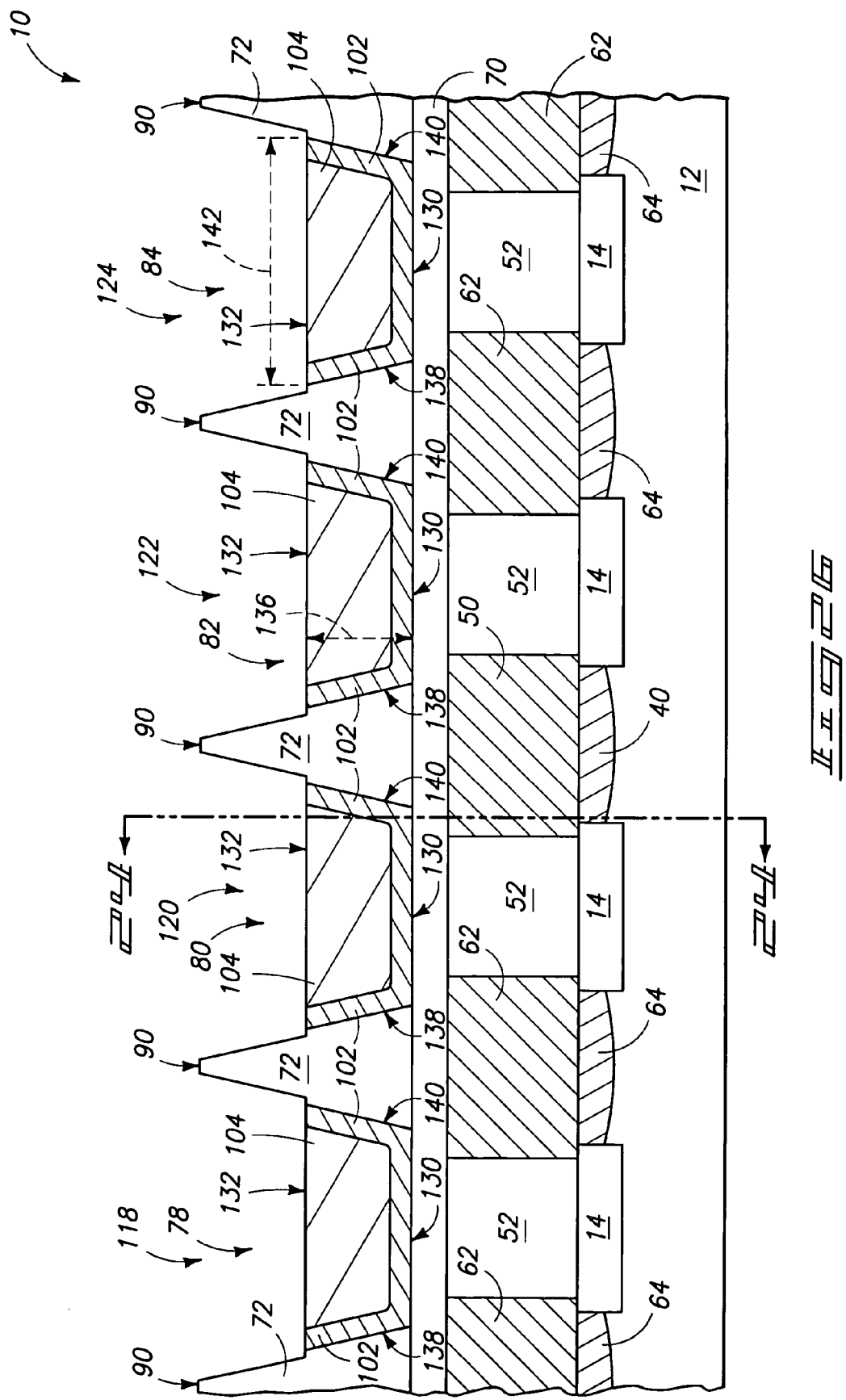

Referring next to FIGS. 24-26, an isotropic etch may be utilized to widen an upper portion of the trenches over conductive lines 116, 118, 120,122 and 124. The etch will typically be conducted under conditions sufficient to remove about 10 nanometers per side of the trenches. It is noted that the etch can be optional in various aspects of the invention.

The shown etch of FIGS. 24-26 can be considered widening an upper portion of the trenches 76, 78, 80, 82 and 84. The etch thus extends a width of the openings over conductive lines 116, 118, 120, 122 and 124 to a lateral width which is greater than the lateral width 142 (FIGS. 22 and 26) of the uppermost portions of the lines.

Figure 27:
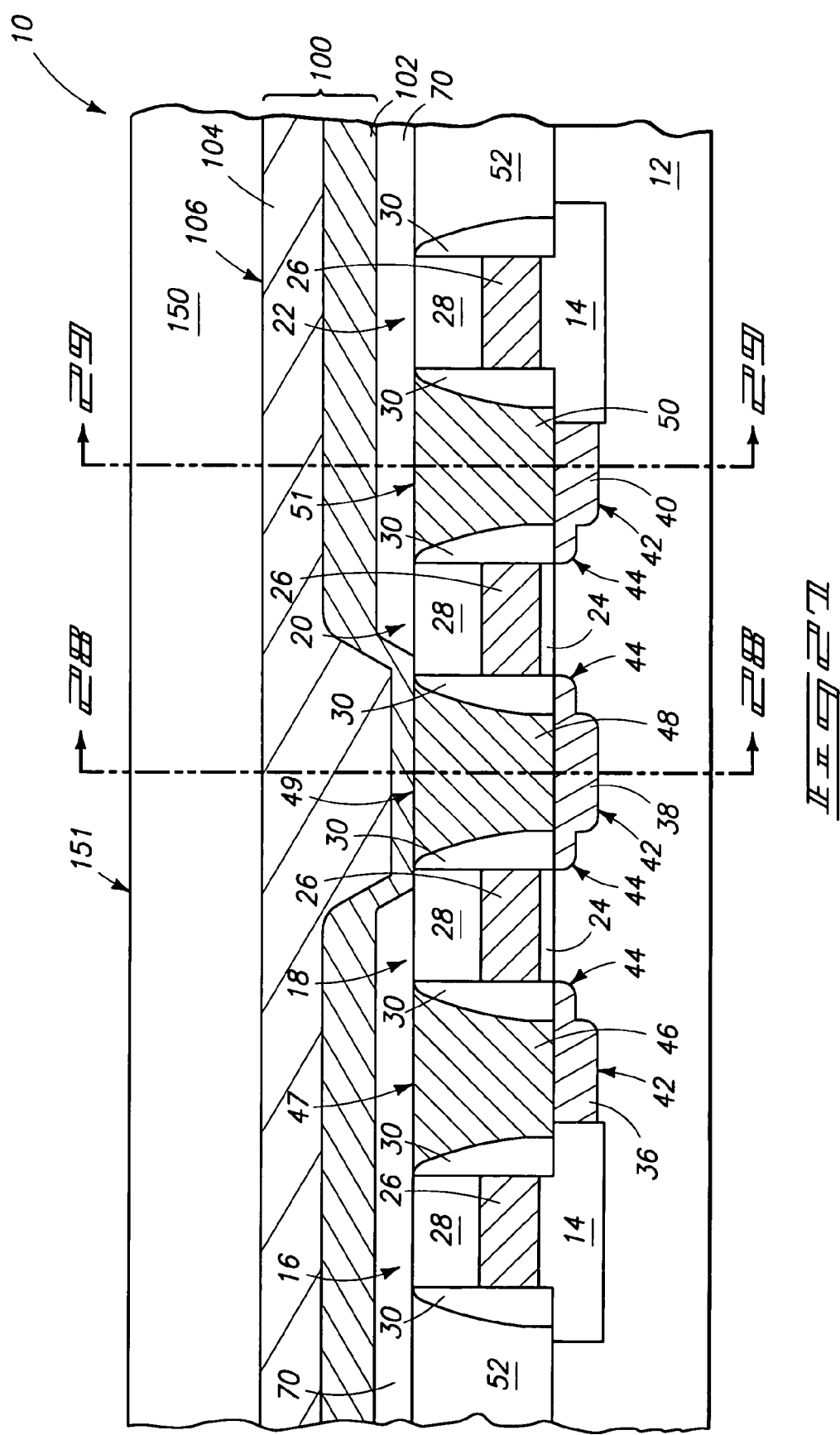
FIGS. 27–29 are views of the cross-sectional fragments of FIGS. 1–3, respectively, shown at a processing stage subsequent to that of FIGS. 24–26. The cross-sections of FIGS. 28 and 29 are along the lines 28—28 and 29—29 of FIG. 27, and the cross-section of FIG. 27 is along the lines 27—27 of FIGS. 28 and 29.
Figure 28:
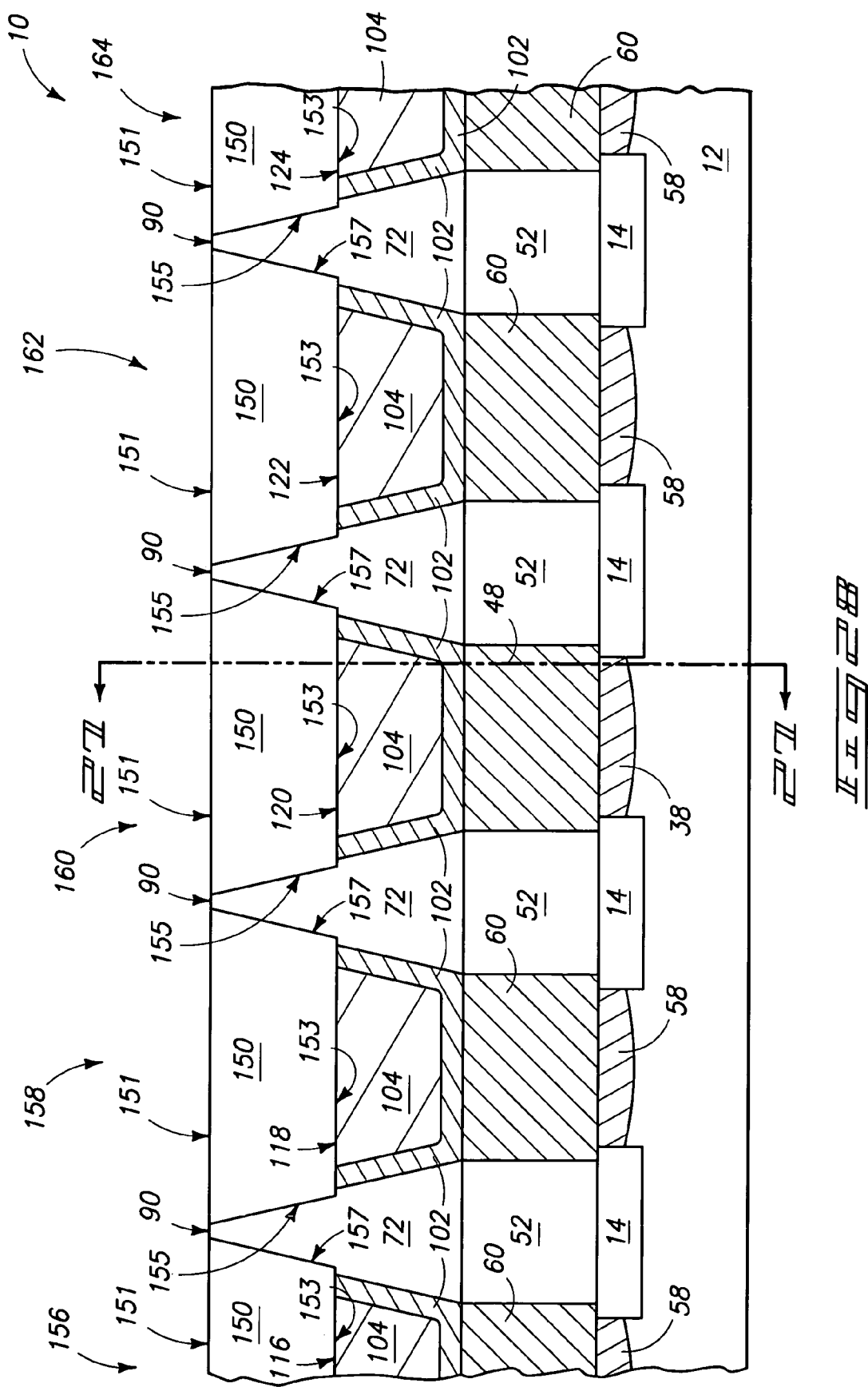
Figure 29:
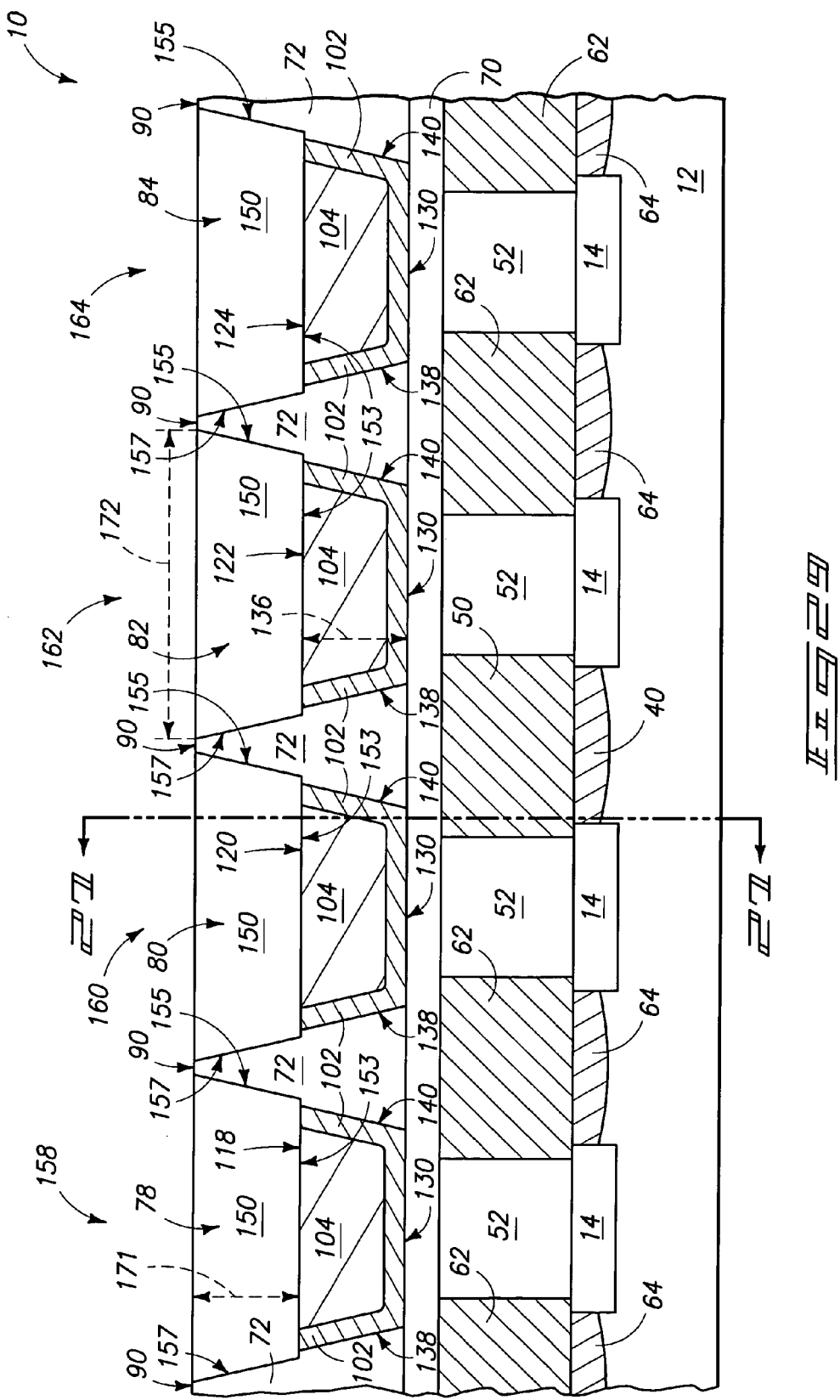

Referring next to FIGS. 27-29, an electrically insulative material 150 is formed within the widened openings over lines 116, 118, 120, 122 and 124. In other words, insulative material 150 is formed within the widened portions of trenches 76, 78, 80, 82 and 84 over the conductive materials 104 and 102 that remain within the lower portion of the trenches. The insulative material 150 is shown comprising a planarized upper surface 151 which is substantially coextensive with the upper surface 90 of insulative material 72. Such can be accomplished by, for example, filling trenches 76, 78, 80, 82 and 84 with sufficient insulative material 150 to completely fill the trenches and to extend over upper surfaces 90 of material 72, and subsequently planarizing material 150 to form the shown planarized upper surface 151. Suitable planarization can be accomplished by, for example, chemical-mechanical polishing.

Although material 150 is shown having a planarized upper surface coextensive with the upper surfaces 90 of material 72 at an elevational height of the upper surface 90 prior to planarization of material 150, it is to be understood that the planarization of material 150 can remove some of the material 72, and accordingly the upper surface 90 of material 72 at the processing stage of FIGS. 27-29 can be lowered relative to its location in prior processing stages. It is also noted that even though material 150 is shown planarized, the invention encompasses other aspects (not shown) wherein material 150 is simply etched back, rather than being planarized.

Insulative material 150 can comprise any suitable electrically insulative material, but preferably will comprise a material to which insulative materials 70 and 72 can be selectively etched. In particular aspects of the invention, material 70 will consist essentially of, or consist of undoped silicon dioxide; material 72 will consist essentially of, or consist of doped silicon dioxide; and material 150 will consist essentially of, or consist of silicon nitride.

Material 150 can be considered to form a series of spaced electrically insulative lines 156, 158, 160, 162 and 164 which are elevationally over the conductive lines 116, 118, 120, 122 and 124, respectively, and which are in a one-to-one correspondence with the conductive lines. The electrically insulative lines 156, 158, 160, 162 and 164 comprise top surfaces 151, bottom surfaces 153, and sidewall surfaces 155 and 157 extending from the bottom surfaces to the top surfaces. Electrically insulative lines 156, 158, 160, 162 and 164 can be considered to form electrically insulative caps over conductive lines 116, 118, 120, 122 and 124, and accordingly the electrically insulative lines can be referred to as electrically insulative caps in particular aspects of the invention.

Insulative lines 156, 158, 160, 162 and 164 comprise a height 171 between the bottom and sidewall surfaces (the height 171 is shown for line 158 in FIG. 29). The insulative lines 156, 158, 160, 162 and 164 further comprise maximum lateral widths 172 extending between the opposing sidewall surfaces 155 and 157 (the width 172 is shown for line 162 in FIG. 29). If the sidewalls of insulative lines 150 are vertical, the lateral width will be constant along the height of the lines; and if the lines comprise sloped sidewalls (as shown) the maximum lateral width will occur at the uppermost surface of the lines.

In various aspects of the invention, insulative materials 70, 72 and 150 can be referred to as first, second and third insulative materials, respectively, to distinguish the materials from one another. In other aspects, insulative materials 70 and 150 can be referred to as first and second insulative materials, respectively; and in yet other aspects insulative materials 72 and 150 can be referred to as first and second insulative materials, respectively.

Figure 30:
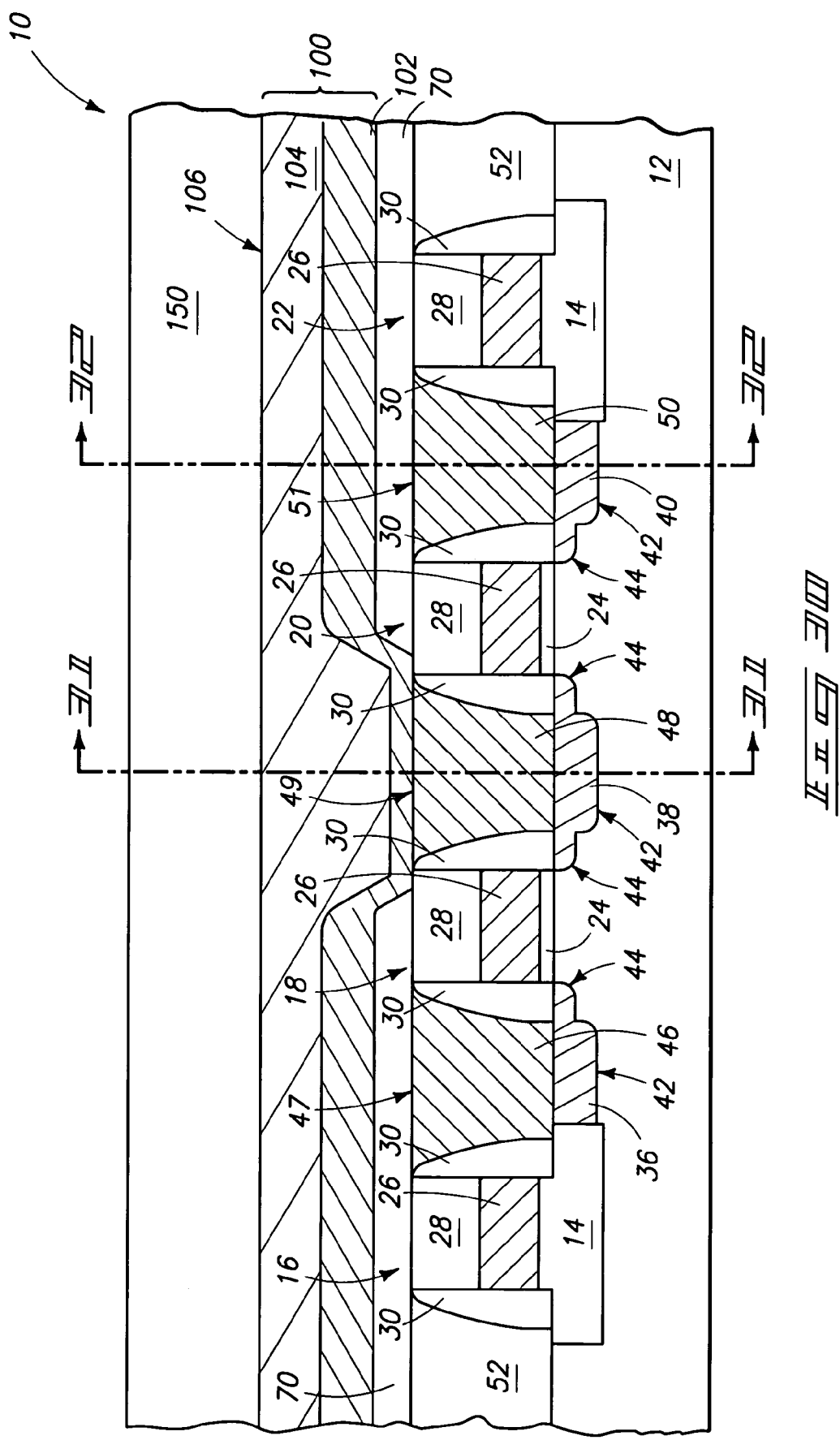
FIGS. 30–32 are views of the cross-sectional fragments of FIGS. 1–3, respectively, shown at a processing stage subsequent to that of FIGS. 27–29. The cross-sections of FIGS. 31 and 32 are along the lines 31—31 and 32—32 of FIG. 30, and the cross-section of FIG. 30 is along the lines 30—30 of FIGS. 31 and 32.
Figure 31:
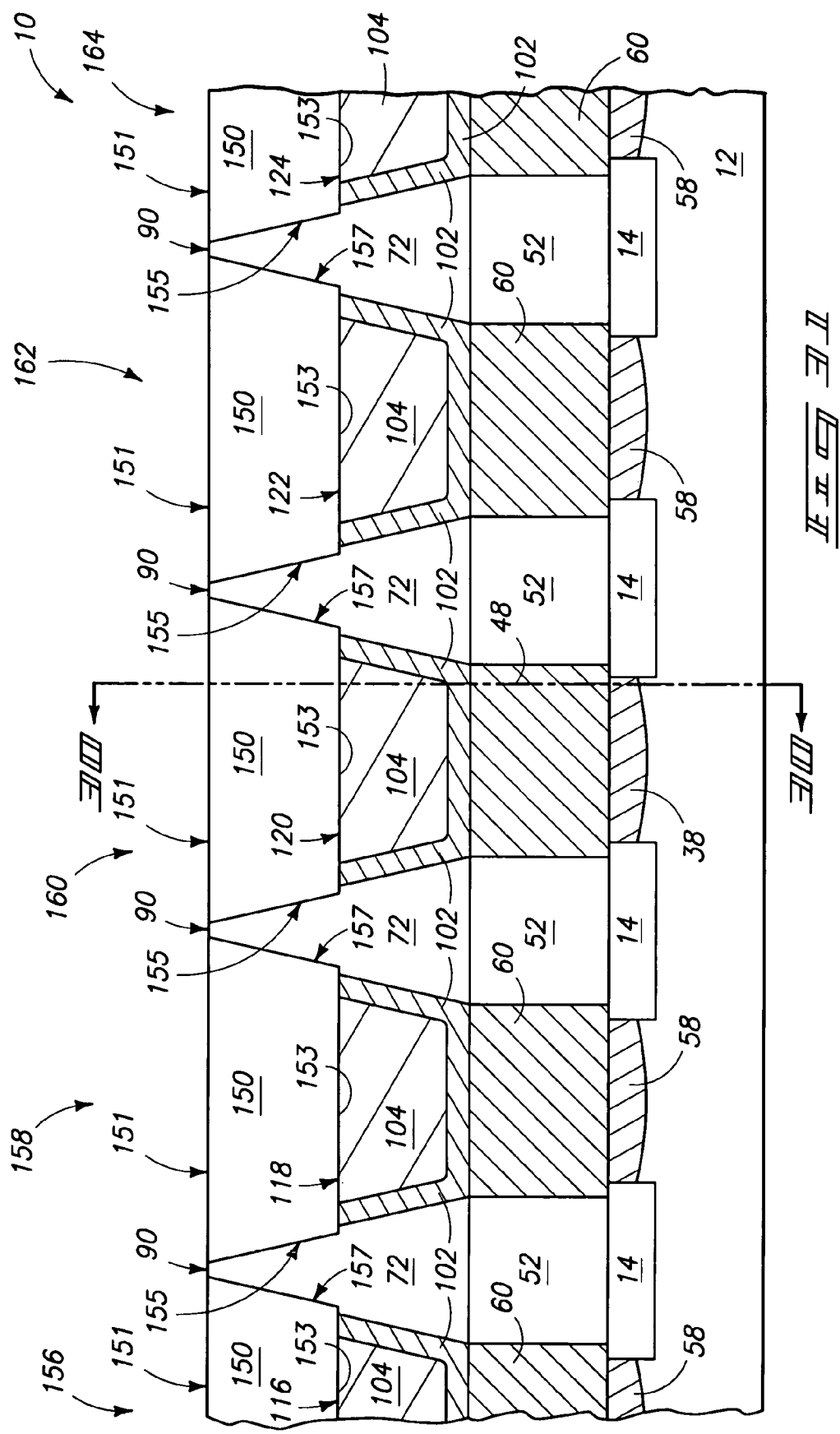
Figure 32:
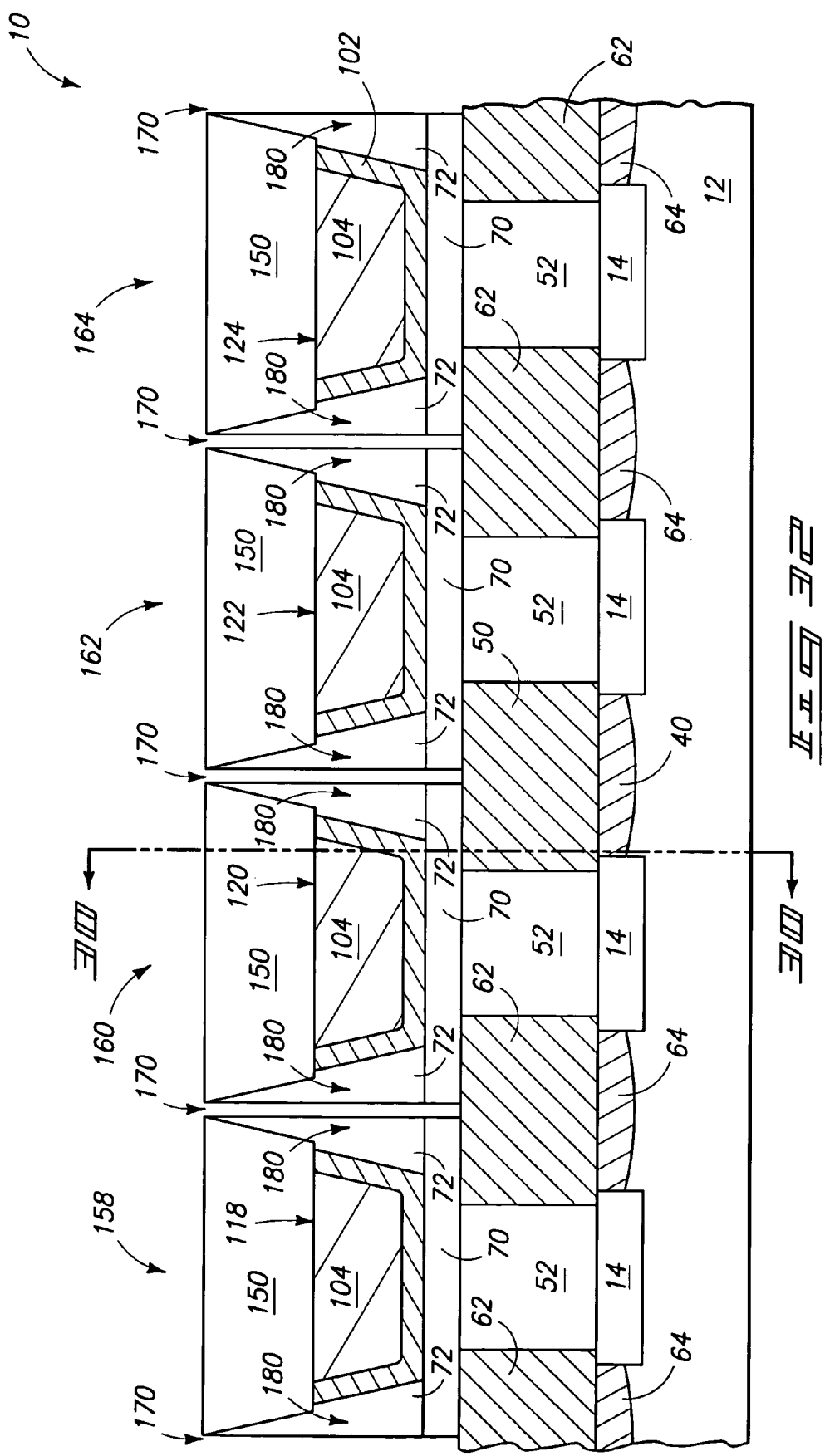
Figure 33:
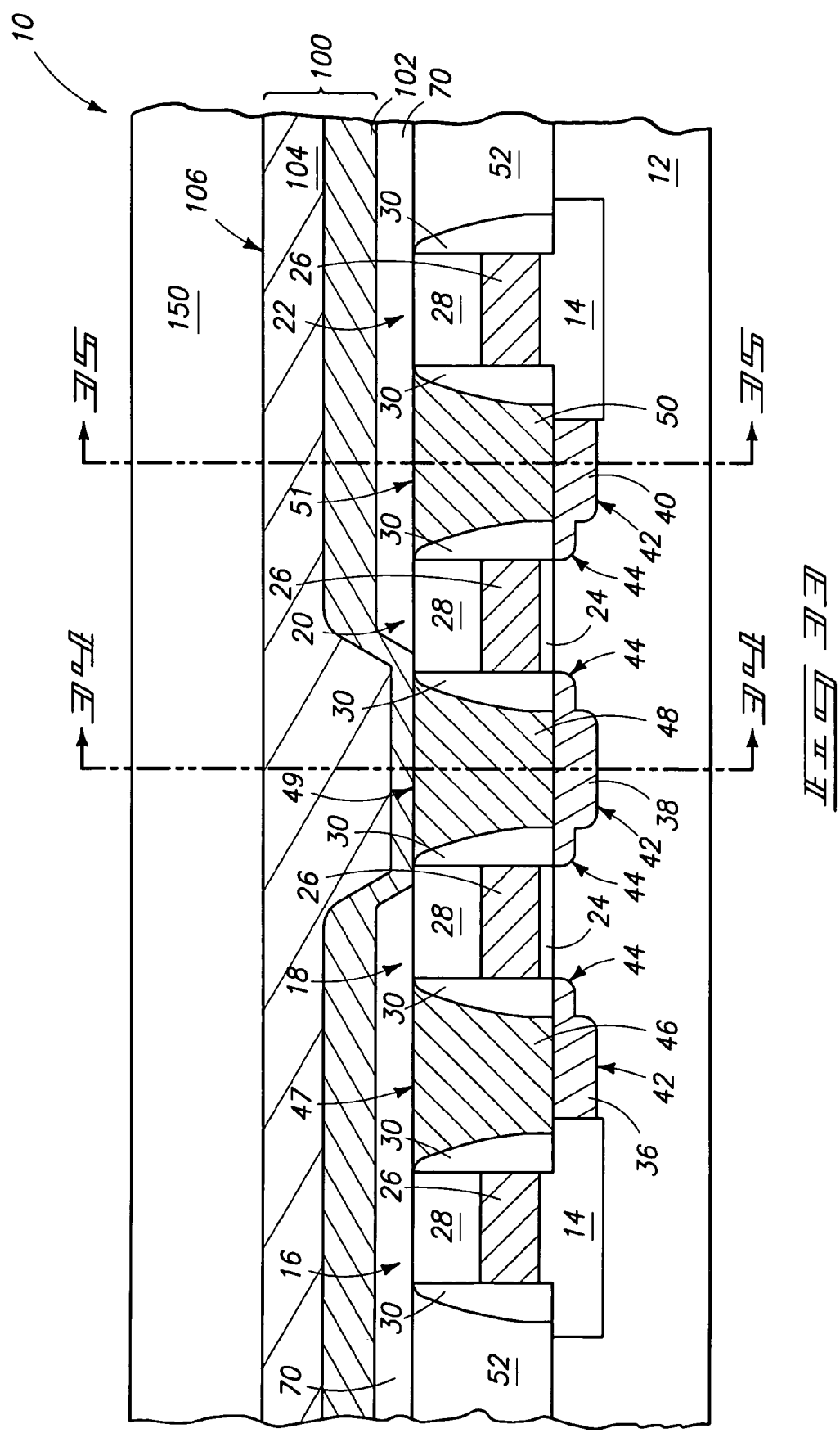
FIGS. 33–35 are views of the cross-sectional fragments of FIGS. 1–3, respectively, shown at a processing stage subsequent to that of FIGS. 30–32. The cross-sections of FIGS. 34 and 35 are along the lines 34—34 and 35—35 of FIG. 33, and the cross-section of FIG. 33 is along the lines 33—33 of FIGS. 34 and 35.
Figure 34:
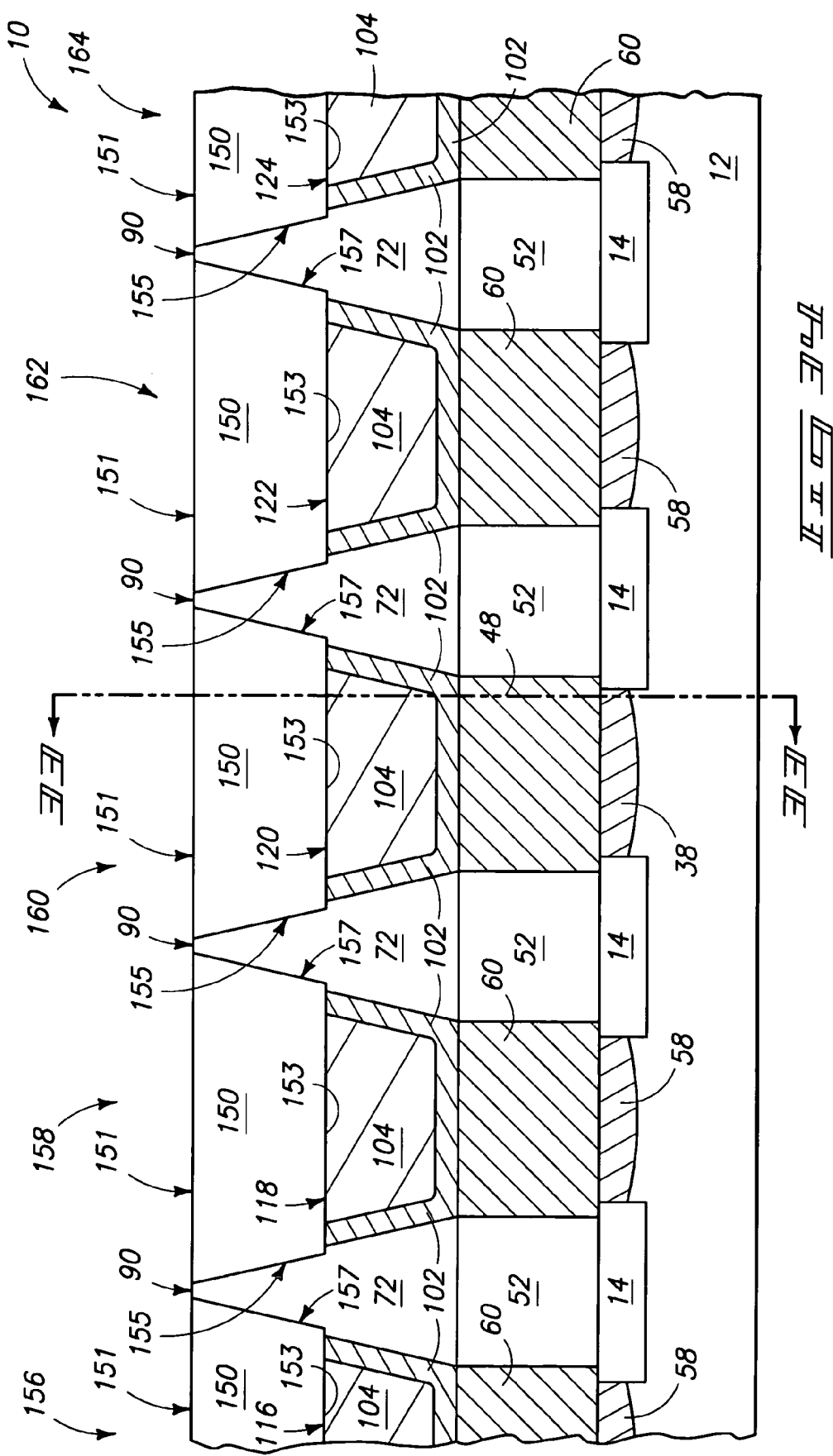
Figure 35:
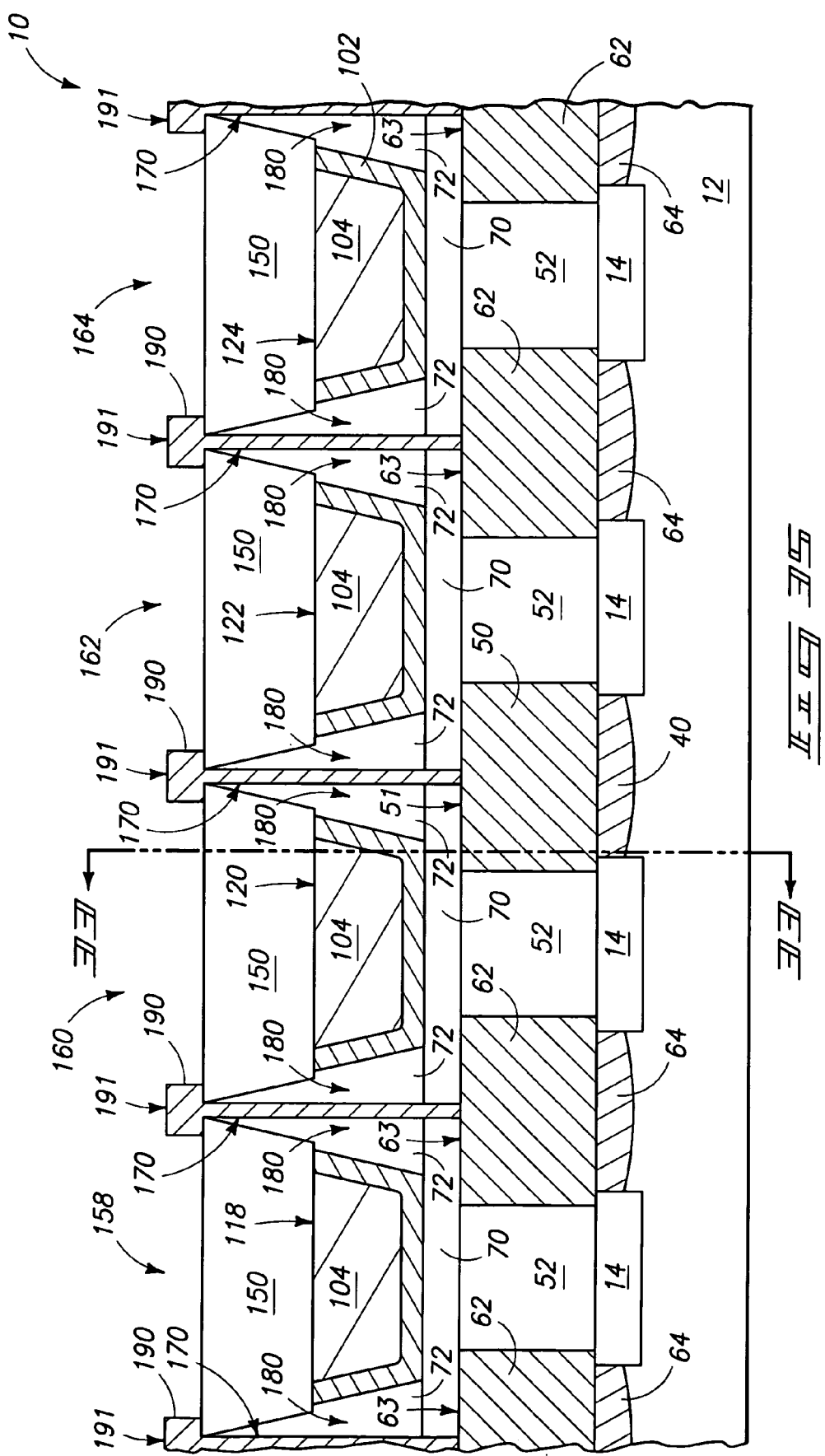

The lateral widths 172 of electrically insulative lines 156, 158, 160, 162 and 164 are larger than the lateral widths 142 (FIG. 26) of the conductive lines 116, 118, 120, 122 and 124. Such enables a self-aligned etch to be conducted to the storage node contact pedestals 46, 62 and 50 as shown in FIGS. 30-32. Specifically, an etch is conducted through materials 72 and 70 while utilizing lines 156, 158, 160, 162 and 164 as an etch mask. The openings are labeled as 170 in FIG. 32, and extend to upper surfaces 51 and 63 of storage node contact pedestals 50 and 62. A protective mask (not shown) can be provided over the region containing the bitline contact pedestals 48 and 60 to protect such region during the etch so that the openings do not extend between the bitline contact pedestals. The protective material can subsequently be removed.

The formation of openings 170 can be considered a self-aligned contact etch utilizing caps 156, 158, 160, 162 and 164 as an overhang to shadow and protect the underlying lines 116, 118, 120, 122 and 124. The openings 170 are shown diagrammatically, and it is to be understood that the relative proportion of the openings to other structures of FIGS. 30-32 can be different than shown. For instance, conductive materials are formed in openings 170 in processing described below, and it can be advantageous to have the width of the openings 170 be proportionately larger than shown in FIGS. 30-32 to allow sufficient room for forming the various materials.

Spacers 180 are formed from the material 72 proximate the openings 170 as the openings are formed. Spacers 180 protect lateral sidewalls of lines 116, 118, 120, 122, and 124, and provide electrical isolation between the lines and conductive material subsequently formed within openings 170. Spacers 180 can be referred to as lateral sidewall spacers which are along the lateral edges of lines 116, 118, 120, 122 and 124. As discussed above, material 72 can comprise, consist essentially of or consist of doped silicon oxide. Accordingly, spacers 180 can comprise, consist essentially of, or consist of doped silicon oxide. In some aspects of the invention, which can be preferred, spacers 180 can comprise, consist essentially of, or consist of low-k dielectric material.

Referring next to FIGS. 33-38, capacitor structures (200, 202, 204, 206 and 208 of FIG. 38) are formed in electrical contact with pedestals 50 and 62. Preferred capacitors will be container capacitors within openings 170, and thus will have a storage node, dielectric material and capacitor plate all extending into openings 170. In the shown diagrammatic view, the proportionate size of openings 170 is too small to show container capacitors formed within the openings, and accordingly the shown capacitors are a less preferred embodiment of the invention in which the storage nodes comprise stems extending through openings 170 to the pedestals 50 and 62. Specific methodology for forming the shown capacitors begins at FIGS. 33–35 with a conductive material 190 being formed within openings 170 and patterned into electrically isolated storage nodes. The patterned material 190 is shown projecting over the upper surface of material 150, but it is to be understood that the invention encompasses other aspects (not shown) in which material 190 has an uppermost surface which is planarized to be coextensive with the uppermost surface of material 150. Conductive material 190 can comprise a homogeneous composition, or can comprise two or more different layers. In particular aspects, material 190 will comprise one or more of metal, metal compound, and a conductively-doped silicon. The capacitor storage nodes have outer exposed surfaces 191, and in particular aspects such surfaces can comprise hemispherical grain polysilicon.

The shown aspect of the invention is but one of many aspects for forming capacitors having storage node electrodes connected to pedestals 50 and 62. For instance, although conductive material 190 is shown entirely filling the openings 170 and utilized to form storage node pedestals 190 over insulative material 150, it is to be understood that the invention encompasses other embodiments (not shown) wherein container-type capacitors are formed within openings 170. In such other embodiments, conductive material 190 would only partially fill openings 170 and would form container shapes within the openings which would be subsequently filled with dielectric material and a second conductive material to form container capacitor constructions within the openings 170.

The conductive material 190 of the storage nodes is shown physically contacting the storage node contact locations at upper surfaces 51 and 63 of the pedestals 50 and 62.

Figure 36:
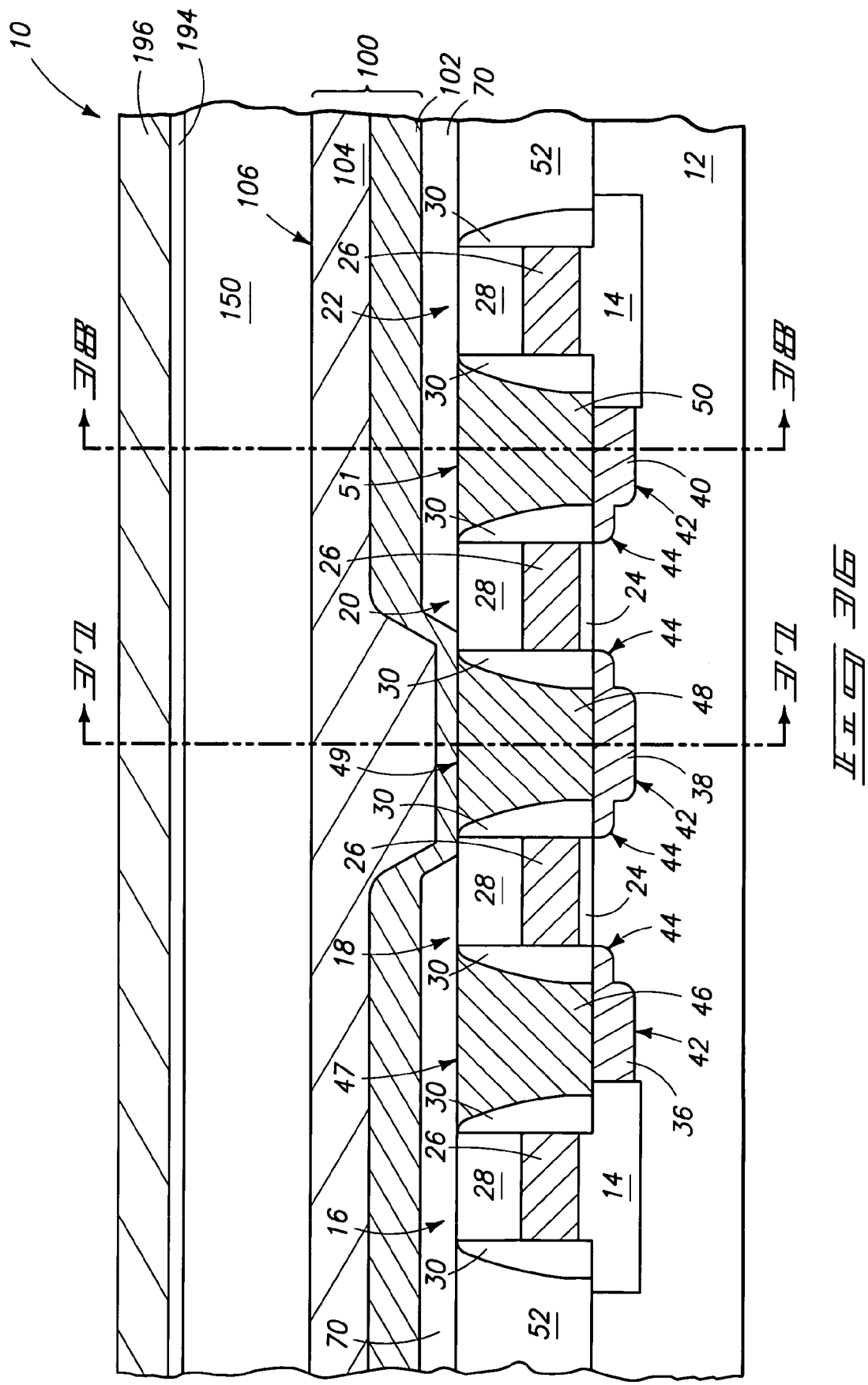
FIGS. 36–38 are views of the cross-sectional fragments of FIGS. 1–3, respectively, shown at a processing stage subsequent to that of FIGS. 33–35. The cross-sections of FIGS. 37 and 38 are along the lines 37—37 and 38—38 of FIG. 36, and the cross-section of FIG. 36 is along the lines 36—36 of FIGS. 37 and 38.
Figure 37:
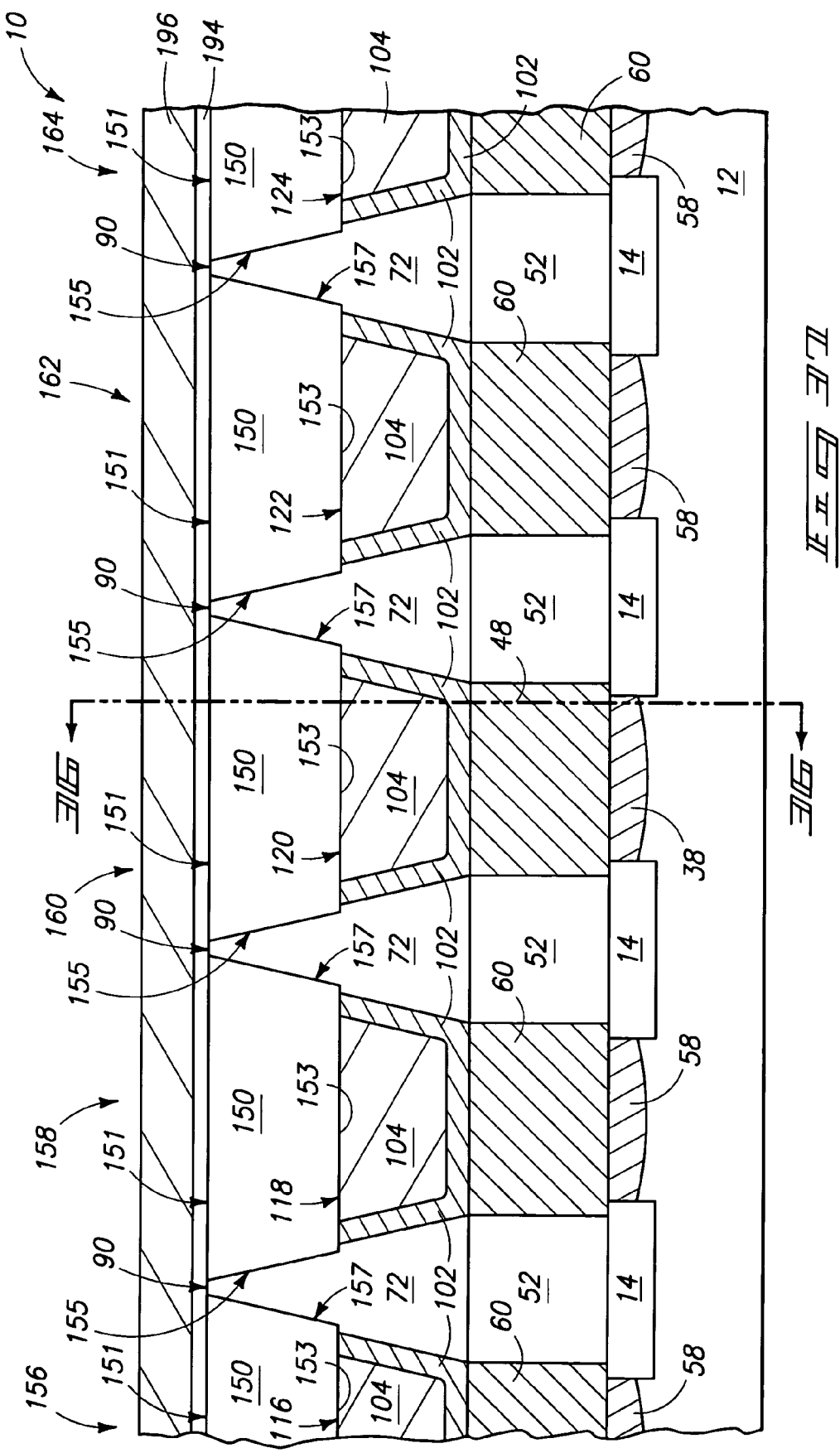
Figure 38:
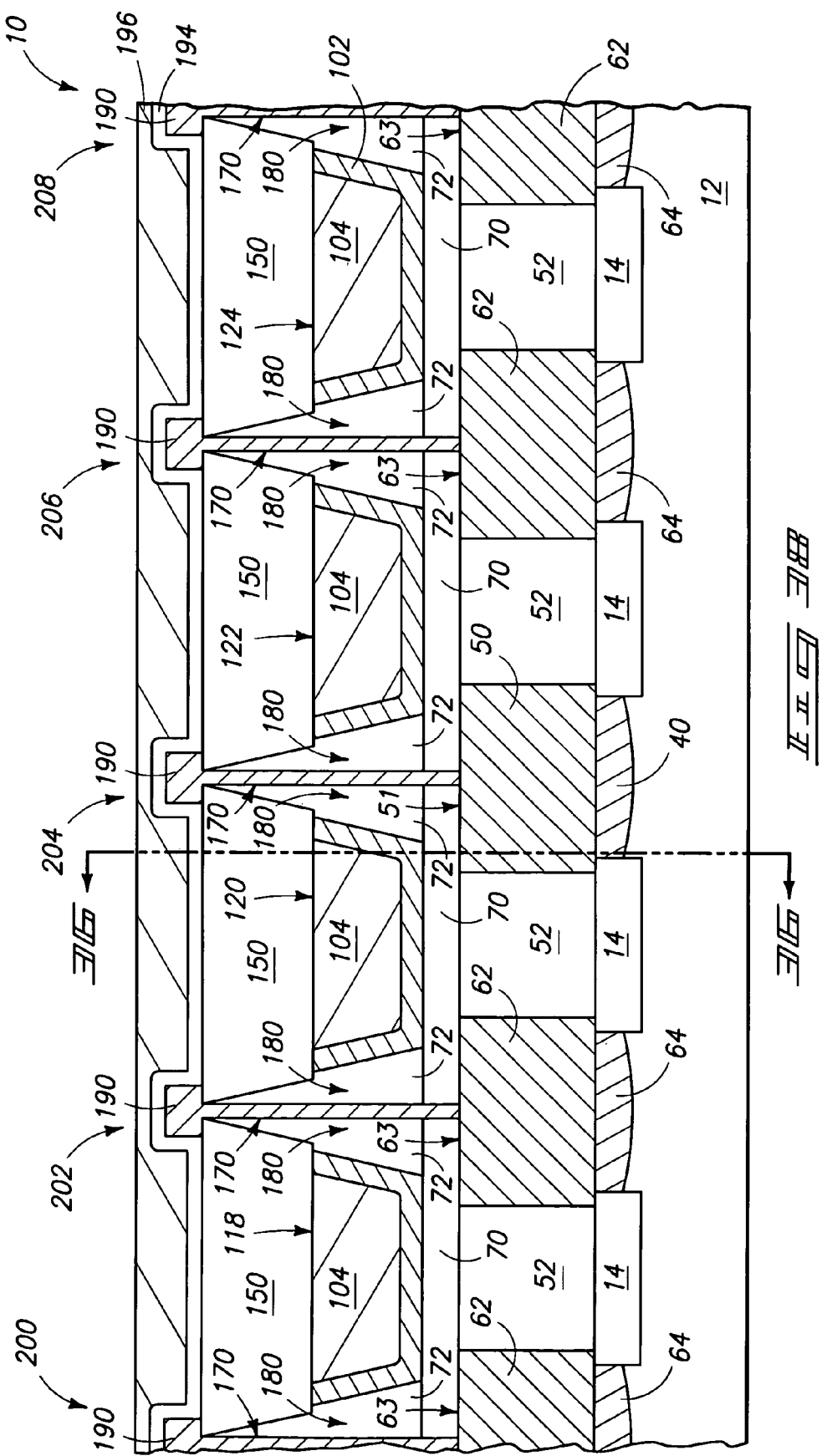

Referring next to FIGS. 36–38, a dielectric material 194 and a second conductive material 196 are provided over storage node material 190 to form a plurality of capacitor constructions 200, 202, 204, 206 and 208. An array of DRAM cells is formed from the capacitors together with the underlying transistor constructions. Lines 116, 118, 120, 122 and 124 form bitline interconnects to the DRAM array.

The methodology described above can be utilized as a damascene bitline fabrication method for any appropriate scale of integration, including, for example, 4F$^2$ DRAM cells, 6F$^2$ DRAM cells, 8F$^2$ DRAM cells, etc. The present invention can provide improvements over the prior art in that reduction in process temperatures and ever decreasing reductions in feature size make gap filling utilizing conventional BPSG and high temperature glass flow unlikely to be suitable for meeting future requirements. In contrast, methodology of the present invention can enable appropriate miniaturization and costs for future integration designs. In some aspects, methodology of the present invention can be utilized for memory array applications in which low bit-line capacitance are desired, or even required; especially for sub-70 nanometer line width applications where metal etching will not be practical. Some examples of such applications are flash memory applications, phase-change memory applications, and resistor change memory applications. The DRAM applications described in the specific aspects of the invention described above utilize capacitors as memory storage constructions, but persons of ordinary skill in the art will recognize that the capacitors can be replaced with other memory storage constructions in memory applications alternative to the DRAM applications.

Figure 39:
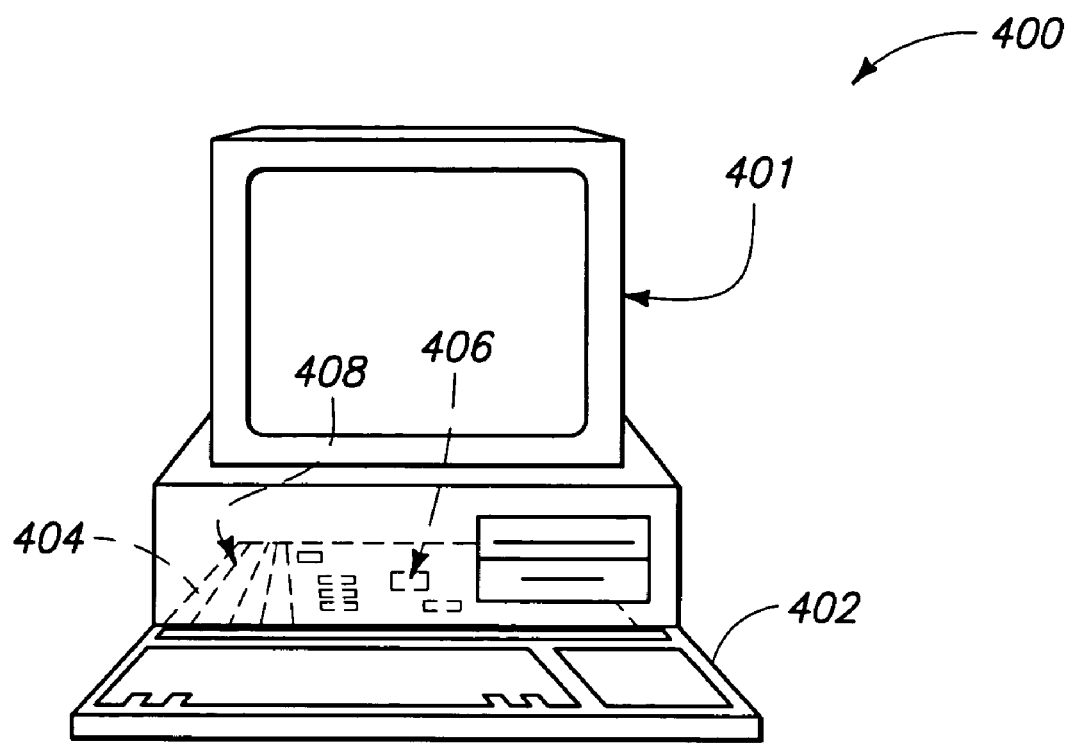
FIG. 39 is a diagrammatic view of a computer illustrating an exemplary application of the present invention.
Figure 40:
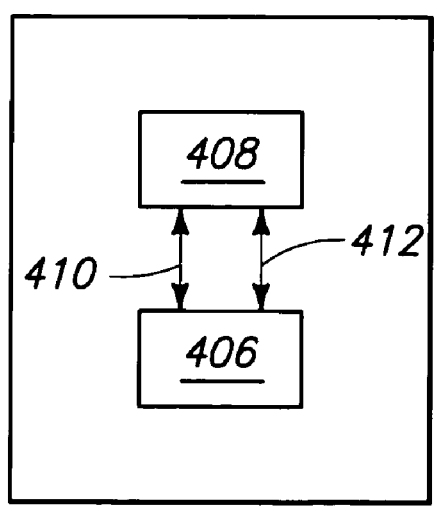
FIG. 40 is a block diagram showing particular features of the motherboard of the FIG. 39 computer.

FIG. 39 illustrates generally, by way of example but not by way of limitation, an embodiment of a computer system 400 according to an aspect of the present invention. Computer system 400 includes a monitor 401 or other communication output device, a keyboard 402 or other communication input device, and a motherboard 404. Motherboard 404 can carry a microprocessor 406 or other data processing unit, and at least one memory device 408. Memory device 408 can comprise various aspects of the invention described above. Memory device 408 can comprise an array of memory cells, and such array can be coupled with addressing circuitry for accessing individual memory cells in the array. Further, the memory cell array can be coupled to a read circuit for reading data from the memory cells. The addressing and read circuitry can be utilized for conveying information between memory device 408 and processor 406. Such is illustrated in the block diagram of the motherboard 404 shown in FIG. 40. In such block diagram, the addressing circuitry is illustrated as 410 and the read circuitry is illustrated as 412. Various components of computer system 400, including processor 406, can comprise one or more of the memory constructions described previously in this disclosure.

Processor device 406 can correspond to a processor module, and associated memory utilized with the module can comprise teachings of the present invention.

Memory device 408 can correspond to a memory module. For example, single in-line memory modules (SIMMs) and dual in-line memory modules (DIMMs) may be used in the implementation which utilize the teachings of the present invention. The memory device can be incorporated into any of a variety of designs which provide different methods of reading from and writing to memory cells of the device. One such method is the page mode operation. Page mode operations in a DRAM are defined by the method of accessing a row of a memory cell arrays and randomly accessing different columns of the array. Data stored at the row and column intersection can be read and output while that column is accessed.

An alternate type of device is the extended data output (EDO) memory which allows data stored at a memory array address to be available as output after the addressed column has been closed. This memory can increase some communication speeds by allowing shorter access signals without reducing the time in which memory output data is available on a memory bus. Other alternative types of devices include SDRAM, DDR SDRAM, SLDRAM, VRAM and Direct RDRAM, as well as others such as SRAM or Flash memories.

Memory device 408 can comprise memory formed in accordance with one or more aspects of the present invention.

FIG. 41 illustrates a simplified block diagram of a high-level organization of various embodiments of an exemplary electronic system 700 of the present invention. System 700 can correspond to, for example, a computer system, a process control system, or any other system that employs a processor and associated memory. Electronic system 700 has functional elements, including a processor or arithmetic/logic unit (ALU) 702, a control unit 704, a memory device unit 706 and an input/output (I/O) device 708. Generally, electronic system 700 will have a native set of instructions that specify operations to be performed on data by the processor 702 and other interactions between the processor 702, the memory device unit 706 and the I/O devices 708.

The control unit 704 coordinates all operations of the processor 702, the memory device 706 and the I/O devices 708 by continuously cycling through a set of operations that cause instructions to be fetched from the memory device 706 and executed. In various embodiments, the memory device 706 includes, but is not limited to, random access memory (RAM) devices, read-only memory (ROM) devices, and peripheral devices such as a floppy disk drive and a compact disk CD-ROM drive. One of ordinary skill in the art will understand, upon reading and comprehending this disclosure, that any of the illustrated electrical components are capable of being fabricated to include memory constructions in accordance with various aspects of the present invention.

FIG. 42 is a simplified block diagram of a high-level organization of various embodiments of an exemplary electronic system 800. The system 800 includes a memory device 802 that has an array of memory cells 804, address decoder 806, row access circuitry 808, column access circuitry 810, read/write control circuitry 812 for controlling operations, and input/output circuitry 814. The memory device 802 further includes power circuitry 816, and sensors 820, such as current sensors for determining whether a memory cell is in a low-threshold conducting state or in a high-threshold non-conducting state. The illustrated power circuitry 816 includes power supply circuitry 880, circuitry 882 for providing a reference voltage, circuitry 884 for providing the first wordline with pulses, circuitry 886 for providing the second wordline with pulses, and circuitry 888 for providing the bitline with pulses. The system 800 also includes a processor 822, or memory controller for memory accessing.

The memory device 802 receives control signals 824 from the processor 822 over wiring or metallization lines. The memory device 802 is used to store data which is accessed via I/O lines. It will be appreciated by those skilled in the art that additional circuitry and control signals can be provided, and that the memory device 802 has been simplified to help focus on the invention. At least one of the processor 822 or memory device 802 can include a memory construction of the type described previously in this disclosure.

The various illustrated systems of this disclosure are intended to provide a general understanding of various applications for the circuitry and structures of the present invention, and are not intended to serve as a complete description of all the elements and features of an electronic system using memory cells in accordance with aspects of the present invention. One of the ordinary skill in the art will understand that the various electronic systems can be fabricated in single-package processing units, or even on a single semiconductor chip, in order to reduce the communication time between the processor and the memory device(s).

Applications for memory cells can include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

It is noted that relative elevational relationships are utilized to describe the locations of various features to one another (e.g., upward, downward, etc are utilized) within this disclosure. It is to be understood that such terms are used to express relative relations between the components only, and not to indicate a relationship of the components relative to an external frame of reference. Thus, for example, a feature described herein as being over another feature may in fact appear to be under the other feature to a viewer in an external frame of reference relative to the features.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming bitline contacts for a memory array, comprising:
    providing a semiconductor substrate having a first set of conductive nodes and a second set of conductive nodes;
    forming an etch stop over the second set of conductive nodes;
    forming an electrically insulative material over the etch stop and over the first set of conductive nodes;
    etching trenches which extend entirely through the electrically insulative material and which do not extend through the etch stop, individual trenches extending across both nodes of the first set and nodes of the second set;
    providing conductive material within the trenches and in electrical contact with the first set of conductive nodes;
    exposing the second set of conductive nodes through the etch stop;
    forming memory storage devices in electrical contact with the exposed second set of conductive nodes; and
    forming a bitline in electrical contact with the conductive material.

2. The method of claim 1 wherein the substrate supports a plurality of transistor constructions; wherein each of the transistor constructions includes a gate which gatedly connects one of the first conductive nodes with one of the second conductive nodes; and wherein the etch stop is elevationally above the gates.

3. The method of claim 2 wherein the transistor construction gates are comprised by a wordline stacks which each contain an electrically insulative cap over one or more electrically conductive materials; and wherein the etch stop is formed to physically contact the electrically insulative caps of at least some of the wordline stacks.

4. The method of claim 2 wherein the transistor construction gates are formed over a semiconductive material of the semiconductor substrate, wherein the transistor constructions comprise source/drain regions extending within the semiconductive material, wherein electrically conductive pedestals are formed over and in electrical connection with the source/drain regions, and wherein the first and second conductive nodes are comprised by uppermost surfaces of the electrically conductive pedestals.

5. The method of claim 1 wherein the etch stop comprises aluminum oxide.

6. The method of claim 1 wherein the etch stop comprises silicon and one or both of oxygen and nitrogen.

7. The method of claim 1 wherein the etch stop comprises silicon dioxide.

8. The method of claim 1 wherein the etch stop comprises silicon nitride.

9. The method of claim 1 wherein the etch stop comprises silicon oxynitride.

10. The method of claim 1 wherein the electrically insulative material comprises one or both of a doped oxide and a low-k dielectric material.

11. The method of claim 1 wherein the memory storage devices are capacitor constructions and wherein the memory array is a DRAM array.

12. The method of claim 1 wherein the memory array is a flash memory array.

13. The method of claim 1 wherein the memory array is a phase change memory array.

14. The method of claim 1 wherein the memory array is a resistor change memory array.

15. A method of forming bitline contacts for a DRAM array, comprising:
provided a semiconductor substrate having a first set of conductive nodes and a second set of conductive nodes;
forming a patterned etch stop over the substrate, the patterned etch stop covering the second set of conductive nodes and having openings extending therethrough to the first set of conductive nodes;
forming an electrically insulative material over the patterned etch stop;
etching trenches which extend entirely through the electrically insulative material, the trenches extending to the patterned etch stop and extending through openings in the patterned etch stop to the first set of conductive nodes;
providing conductive material within the trenches and in electrical contact with the first set of conductive nodes;
exposing the second set of conductive nodes through the etch stop;
forming capacitors having storage nodes in electrical contact with the exposed second set of conductive nodes; and
forming a bitline in electrical contact with the conductive material.

16. The method of claim 15 wherein the substrate supports a plurality of transistor constructions; wherein each of the transistor constructions includes a gate which gatedly connects one of the first conductive nodes with one of the second conductive nodes; and wherein the patterned etch stop is elevationally above the gates.

17. The method of claim 16 wherein the transistor construction gates are comprised by a wordline stacks which each contain an electrically insulative cap over one or more electrically conductive materials; and wherein the patterned etch stop is formed to physically contact the electrically insulative caps of at least some of the wordline stacks.

18. The method of claim 17 wherein electrically insulative sidewall spacers extend along sidewalls of the wordline stacks; and wherein the patterned etch stop is formed to physically contact at least some of the electrically insulative sidewall spacers.

19. The method of claim 16 wherein the transistor construction gates are formed over a semiconductive material of the semiconductor substrate, wherein the transistor constructions comprise source/drain regions extending within the semiconductive material, wherein electrically conductive pedestals are formed over and in electrical connection with the source/drain regions, and wherein the first and second conductive nodes are comprised by uppermost surfaces of the electrically conductive pedestals.

20. The method of claim 15 wherein the patterned etch stop comprises aluminum oxide.

21. The method of claim 15 wherein the patterned etch stop comprises silicon and one or both of oxygen and nitrogen.

22. The method of claim 21 wherein the patterned etch stop comprises silicon dioxide.

23. The method of claim 21 wherein the patterned etch stop comprises silicon nitride.

24. The method of claim 21 wherein the patterned etch stop comprises silicon oxynitride.

25. The method of claim 15 wherein the electrically insulative material comprises one or both of a doped oxide and a low-k dielectric material.

26. The method of claim 15 wherein the providing the electrically conductive material within the trenches comprises:
forming tantalum nitride to partially fill the trenches; and
forming copper within the partially-filled trenches to completely fill the trenches.

27. The method of claim 15 wherein the providing the electrically conductive material within the trenches comprises:
forming a conductive stack of Ti and one or both of titanium nitride and tungsten nitride to partially fill the trenches; and
forming tungsten within the partially-filled trenches to completely fill the trenches.

28. The method of claim 27 wherein the electrically insulative material has an uppermost surface, wherein the tungsten and conductive stack extend across the uppermost surface of the electrically insulative material, and further comprising planarization of the tungsten and conductive stack to reduce an elevation height of the tungsten and conductive stack to about the height of the uppermost surface of the electrically insulative material and thereby form a plurality of electrically conductive lines from the conductive stack and tungsten within the trenches.

29. The method of claim 28 wherein the trenches have depth, and further comprising reducing a height of the electrically conductive lines within the trenches so that the lines fill less than or equal to about one-half of the depth of the trenches.

30. The method of claim 29 wherein substrate includes a memory array region and another region peripheral to the memory array region; wherein the trenches extend across the memory array region and across at least a portion of the region peripheral to the memory array region; and wherein the reducing of the height of the electrically conductive lines occurs only in portions of the trenches which are over the memory array region and not in portions of the trenches which are over the region peripheral to the memory array region.

31. The method of claim 29 further comprising forming an electrically insulative cap over the electrically conductive lines within the trenches.

32. The method of claim 31 further comprising widening an upper region of the trenches with an etch of the electrically insulative material after the reducing of the height of the electrically conductive lines and prior to formation of the electrically insulative cap.

33. The method of claim 31 wherein the forming the electrically insulative cap comprises forming silicon nitride over the electrically conductive lines within the trenches to completely fill the trenches, and subsequently planarizing an uppermost surface of the silicon nitride.

34. The method of claim 31 wherein the exposing of the second set of conductive nodes comprises etching the insulative material and patterned etch stop with an etch which is self-aligned to the electrically insulative cap to form openings extending to the second set of conductive nodes; and wherein the capacitor storage nodes are formed within the openings.

35. A method of forming a contact to a bitline, comprising:
providing a semiconductor construction which includes a plurality of storage node contact locations and a plurality of bitline contact locations;
forming an etch stop which is over the storage node contact locations and not over the bitline contact locations;
forming an electrically insulative material over the etch stop;
etching trenches into the electrically insulative material, the trenches extending entirely through the electrically insulative material to the bitline contact locations and to the etch stop;
forming electrically conductive lines within the trenches and in electrical contact with the bitline contact locations;
after forming the electrically conductive lines, forming openings extending through the etch stop to the storage node contact locations;
forming capacitor storage nodes in the openings which extend through the etch stop, the capacitor storage nodes being in electrical contact with the storage node contact locations; and
forming a bitline in electrical contact with the conductive lines.

36. The method of claim 35 wherein the forming the electrically conductive lines comprises filling the trenches with at least two conductive materials.

37. The method of claim 35 wherein the forming the electrically conductive lines comprises:
filling the trenches with at least two conductive materials; and
reducing an amount of the conductive materials within the trenches so that the trenches are less than entirely filled with the at least two conductive materials.

38. The method of claim 35 wherein:
the electrically insulative material is a first electrically insulative material;
the trenches are first trenches;
the forming the electrically conductive lines comprises:
filling the first trenches with at least two conductive materials; and
reducing an amount of the conductive materials within the first trenches to form second trenches over the electrically conductive materials, the reducing the amount forming the conductive materials into the conductive lines, the conductive lines having first lateral widths; and
the forming the openings extending through the etch stop comprises:
forming second electrically insulative material within the trenches to form electrically insulative caps having second lateral widths which are wider than the first lateral widths of the electrically conductive lines; and
using the electrically insulative caps as a mask during etching to form openings extending through the first electrically insulative material and etch stop to the storage node contact locations.

39. The method of claim 38 further comprising:
forming dielectric material over the capacitor storage nodes; and
forming capacitor electrode material over the dielectric material, the capacitor electrode material, dielectric material and storage nodes together being incorporated into capacitors.

40. The method of claim 35 wherein the etch stop comprises aluminum oxide.

41. The method of claim 35 wherein the etch stop comprises silicon and one or both of oxygen and nitrogen.

42. The method of claim 41 wherein the etch stop comprises silicon dioxide.

43. The method of claim 41 wherein the etch stop comprises silicon nitride.

44. The method of claim 41 wherein the etch stop comprises silicon oxynitride.

45. The method of claim 35 wherein the etch stop consists essentially of silicon and one or both of oxygen and nitrogen.

46. The method of claim 35 wherein the etch stop consists essentially of aluminum oxide.

47. The method of claim 35 wherein the etch stop consists of aluminum oxide.

48. The method of claim 35 wherein the etch stop consists of silicon and one or both of oxygen and nitrogen.

49. The method of claim 48 wherein the etch stop consists of silicon nitride.

50. The method of claim 48 wherein the etch stop consists of silicon oxynitride.

51. The method of claim 48 wherein the etch stop consists of silicon dioxide.

52. The method of claim 35 wherein the electrically conductive lines comprise one or more of tungsten, titanium, copper, tantalum nitride, tungsten nitride and titanium nitride.

53. The method of claim 35 wherein the electrically insulative material comprises a doped oxide.

54. The method of claim 35 wherein the electrically insulative material comprises a doped oxide and wherein the etch stop comprises an undoped oxide.

55. The method of claim 35 wherein the bitline contact locations and storage node contact locations comprise upper surfaces of electrically conductive pedestals; wherein the electrically insulative material comprises a doped oxide, and wherein the etch stop comprises an undoped oxide.

* * * * *